(12) United States Patent
Wu et al.

(10) Patent No.: US 12,321,549 B2
(45) Date of Patent: Jun. 3, 2025

(54) ELECTRONIC DEVICE

(71) Applicant: InnoLux Corporation, Miao-Li County (TW)

(72) Inventors: Yuan-Lin Wu, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/382,532

(22) Filed: Oct. 23, 2023

(65) Prior Publication Data

US 2024/0176446 A1   May 30, 2024

(30) Foreign Application Priority Data

Nov. 29, 2022   (CN) .......................... 202211508548.8

(51) Int. Cl.
| | | |
|---|---|---|
| H10K 59/40 | (2023.01) | |
| G06F 3/041 | (2006.01) | |
| G06F 3/044 | (2006.01) | |
| H10K 77/10 | (2023.01) | |
| H10K 102/00 | (2023.01) | |

(52) U.S. Cl.
CPC ...... *G06F 3/041662* (2019.05); *G06F 3/0412* (2013.01); *G06F 3/041661* (2019.05); *G06F 3/044* (2013.01); *H10K 59/40* (2023.02); *H10K 77/111* (2023.02); *G06F 2203/04102* (2013.01); *H10K 2102/311* (2023.02)

(58) Field of Classification Search
CPC ............. G06F 3/041662; G06F 3/0412; G06F 3/041661; G06F 3/044; G06F 2203/04102; H10K 59/40; H10K 77/111; H10K 2102/311

See application file for complete search history.

(56) References Cited

U.S. PATENT DOCUMENTS

| | | | |
|---|---|---|---|
| 11,398,107 B2 * | 7/2022 | Kim | ......................... G06F 21/32 |
| 2011/0187677 A1 * | 8/2011 | Hotelling | .............. G06F 3/0443 |
| | | | 345/174 |
| 2017/0345845 A1 * | 11/2017 | Wu | ........................ H01L 27/124 |
| 2019/0187852 A1 * | 6/2019 | Jin | ....................... G06F 3/04164 |
| 2019/0385551 A1 * | 12/2019 | Kim | .................... G02F 1/13338 |
| 2020/0167037 A1 * | 5/2020 | Lee | ........................ G06F 3/0446 |
| 2021/0405819 A1 | 12/2021 | Seo | |
| 2022/0102680 A1 | 3/2022 | Park | |

* cited by examiner

*Primary Examiner* — Mihir K Rayan
(74) *Attorney, Agent, or Firm* — Winston Hsu

(57) ABSTRACT

The present disclosure provides an electronic device including a substrate, a circuit layer, an organic structure, and a sensing structure. The circuit layer is disposed on the substrate, and the circuit layer includes a switch. The organic structure is disposed on the substrate, and in a top view of the electronic device, the organic structure is adjacent to an edge of the substrate. The sensing structure is disposed on the circuit layer, and the sensing structure includes a sensing unit and a wire electrically connected to the sensing unit. The wire crosses over the organic structure and is electrically connected to the switch.

19 Claims, 18 Drawing Sheets

ELECTRONIC DEVICE

BACKGROUND OF THE DISCLOSURE

1. Field of the Disclosure

The present disclosure relates to an electronic device and particularly to an electronic device with a sensing structure.

2. Description of the Prior Art

Since electronic devices are able to meet various requirements of users, they have become an essential tool in people's lives. For example, some of the electronic devices have been developed to have both a display function and a touch function so as to perform human-computer interaction. However, in a conventional electronic device, a touch panel used to detect a stylus is attached to a lower side of a panel with the display function, and therefore, the design of the conventional electronic device is limited, such that its cost cannot be further reduced, and its overall thickness and weight also cannot be reduced.

SUMMARY OF THE DISCLOSURE

It is an objective of the present disclosure to provide an electrode device to solve issues as mentioned above.

According to some embodiments of the present disclosure, an electronic device is provided and includes a substrate, a circuit layer, an organic structure, and a sensing structure. The circuit layer is disposed on the substrate, and the circuit layer includes a switch. The organic structure is disposed on the substrate, and in a top view of the electronic device, the organic structure is adjacent to an edge of the substrate. The sensing structure is disposed on the circuit layer, and the sensing structure includes a sensing unit and a wire electrically connected to the sensing unit. The wire crosses over the organic structure and is electrically connected to the switch.

These and other objectives of the present disclosure will no doubt become obvious to those of ordinary skill in the art after reading the following detailed description of the embodiment that is illustrated in the various figures and drawings.

DETAILED DESCRIPTION

Figure 1:
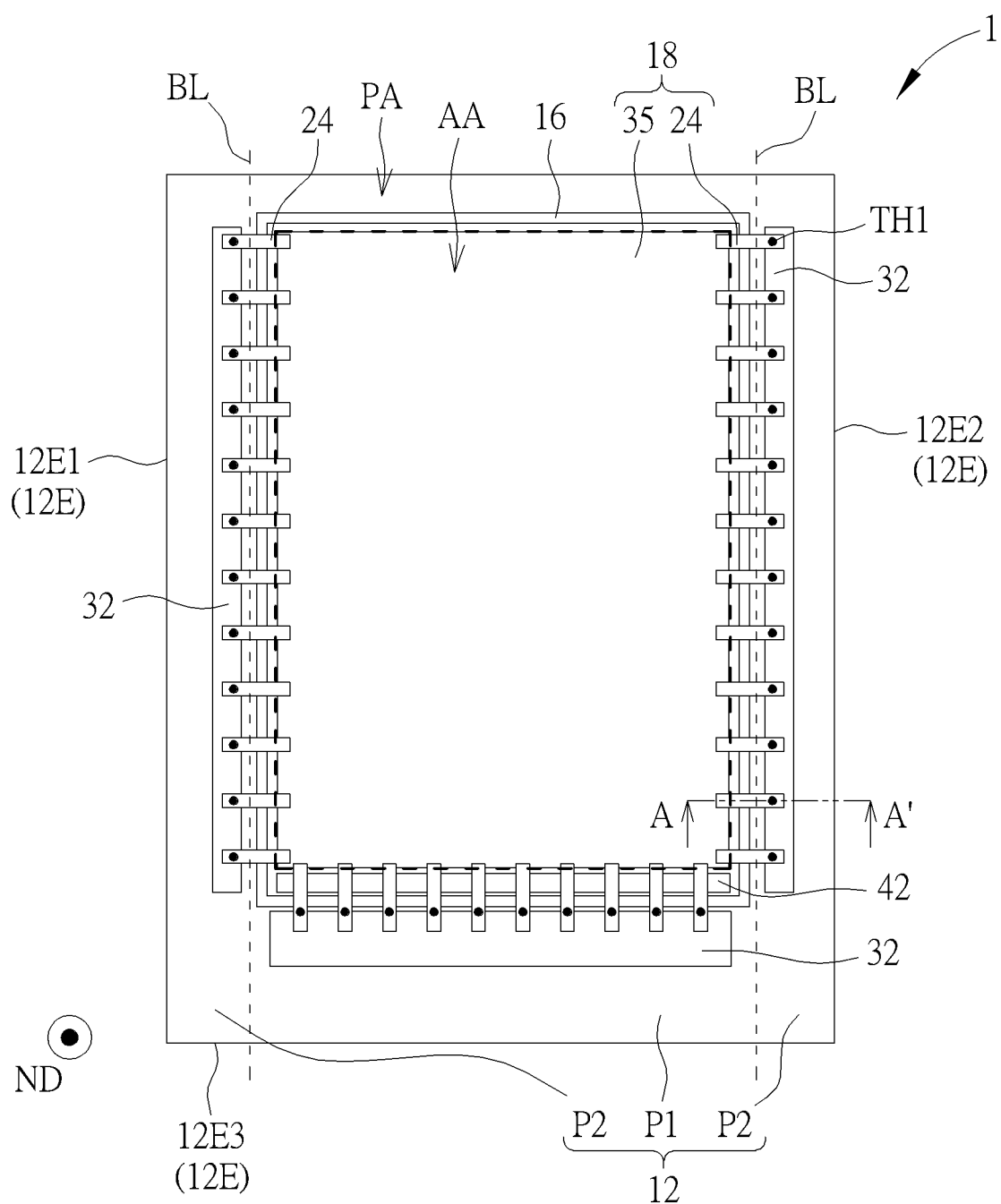
FIG. 1 schematically illustrates a top view of an electronic device according to a first embodiment of the present disclosure.

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and sizes of the elements in the drawings are just illustrative and are not intended to limit the scope of the present disclosure.

Certain terms are used throughout the specification and the appended claims of the present disclosure to refer to specific elements. Those skilled in the art should understand that electronic equipment manufacturers may refer to an element by different names, and this document does not intend to distinguish between elements that differ in name but not function. In the following specification and claims, the terms "comprise", "include" and "have" are open-ended fashion, so they should be interpreted as "including but not limited to . . . ".

The ordinal numbers used in the specification and the appended claims, such as "first", "second", etc., are used to describe the elements of the claims. It does not mean that the element has any previous ordinal numbers, nor does it represent the order of a certain element and another element, or the sequence in a manufacturing method. These ordinal numbers are just used to make a claimed element with a certain name be clearly distinguishable from another claimed element with the same name.

Spatially relative terms, such as "above", "on", "beneath", "below", "under", "left", "right", "before", "front", "after", "behind" and the like, used in the following embodiments just refer to the directions in the drawings and are not intended to limit the present disclosure.

In addition, when one element or layer is "on" or "above" another element or layer or is "connected to" the another element or layer, it may be understood that the element or layer is directly on the another element or layer or directly connected to the another element or layer, and alternatively, another element or layer may be between the element or layer and the another element or layer (indirectly). On the contrary, when the element or layer is "directly on" the another element or layer or is "directly connected to" the another element or layer, it may be understood that there is no intervening element or layer between the element or layer and the another element or layer. Also, the term "electrically connected" or "coupled" includes means of direct or indirect electrical connection.

As disclosed herein, the terms "approximately", "essentially", "about", or "substantially" generally mean within 20%, 10%, 5%, 3%, 28, 1%, or 0.5% of the reported numerical value or range. The quantity disclosed herein is an approximate quantity, that is, without a specific description of "approximately", "essentially", "about", or "substantially", the quantity may still include the meaning of "approximately", "essentially", "about", or "substantially".

It should be understood that according to the following embodiments, features of different embodiments may be replaced, recombined or mixed to constitute other embodiments without departing from the spirit of the present disclosure. The features of various embodiments may be mixed arbitrarily and used in different embodiments without departing from the spirit of the present disclosure or conflicting.

In the present disclosure, the length, thickness, width, height, distance, and area may be measured by using an optical microscope (OM), a scanning electron microscope (SEM) or other approaches, but not limited thereto.

Unless otherwise defined, all terms (including technical and scientific terms) used herein have the same meaning as commonly understood by those skilled in the art. It should be understood that these terms, such as those defined in commonly used dictionaries, should be interpreted as having meaning consistent with the relevant technology and the background or context of the present disclosure, and should not be interpreted in an idealized or excessively formal way, unless there is a specific definition in the embodiments of the present disclosure.

An electronic device of the present disclosure may be a bendable, stretchable, foldable, rollable and/or flexible electronic device, but not limited thereto. In the present disclosure, the electronic device may include a light emitting device, a sensing device, a display device, an antenna device, a touch device, a tiled device or other suitable devices, but not limited thereto. The display device may, for example, be applied to a laptop, a public display, a tiled display, a vehicle display, a touch display, a television, a monitor, a smartphone, a tablet, a light source module, a lighting device or an electronic device applied to the above product, but not limited thereto. The sensing device may, for example, be a sensing device used for detecting change in capacitances, light, heat, or ultrasound, but not limited thereto. The sensing device may for example be used for detecting changes in capacitances, light, heat or ultrasound, but not limited thereto. The sensing device may, for example, include a biosensor, a touch sensor, a fingerprint sensor, other suitable sensors or any combination of sensors mentioned above. The display device may, for example, include a light emitting element, a fluorescent material, a phosphor material, other suitable display mediums, or any combination thereof, but not limited thereto. The light emitting element may, for example, include an organic light emitting diode (OLED), a mini light emitting diode (mini-LED), a micro light emitting diode (micro LED), a quantum dot light emitting diode (e.g., QLED or QDLED), other suitable elements or any combination of elements mentioned above. The antenna device may, for example, include liquid crystal antenna or antennas of other types, but not limited thereto. The tiled device may, for example, include a tiled display device or a tiled antenna device, but not limited thereto. Furthermore, the appearance of the electronic device may be rectangular, circular, polygonal, a shape with curved edges, curved or other suitable shapes, but not limited thereto. The electronic device may have peripheral systems such as a driving system, a control system, a light source system, a shelf system, etc. The electronic device may include electronic units, in which the electronic units may include a passive element and an active element, and for example include a capacitor, a resistor, an inductor, a diode, a transistor, a sensor, etc. It is noted that the electronic device of the present disclosure may be any combination of the above-mentioned devices, but not limited thereto. The electronic device mentioned in the following contents and drawings is taken as an electronic device with a touch sensing function for an example to describe the present disclosure, but the present disclosure is not limited thereto.

Figure 2:
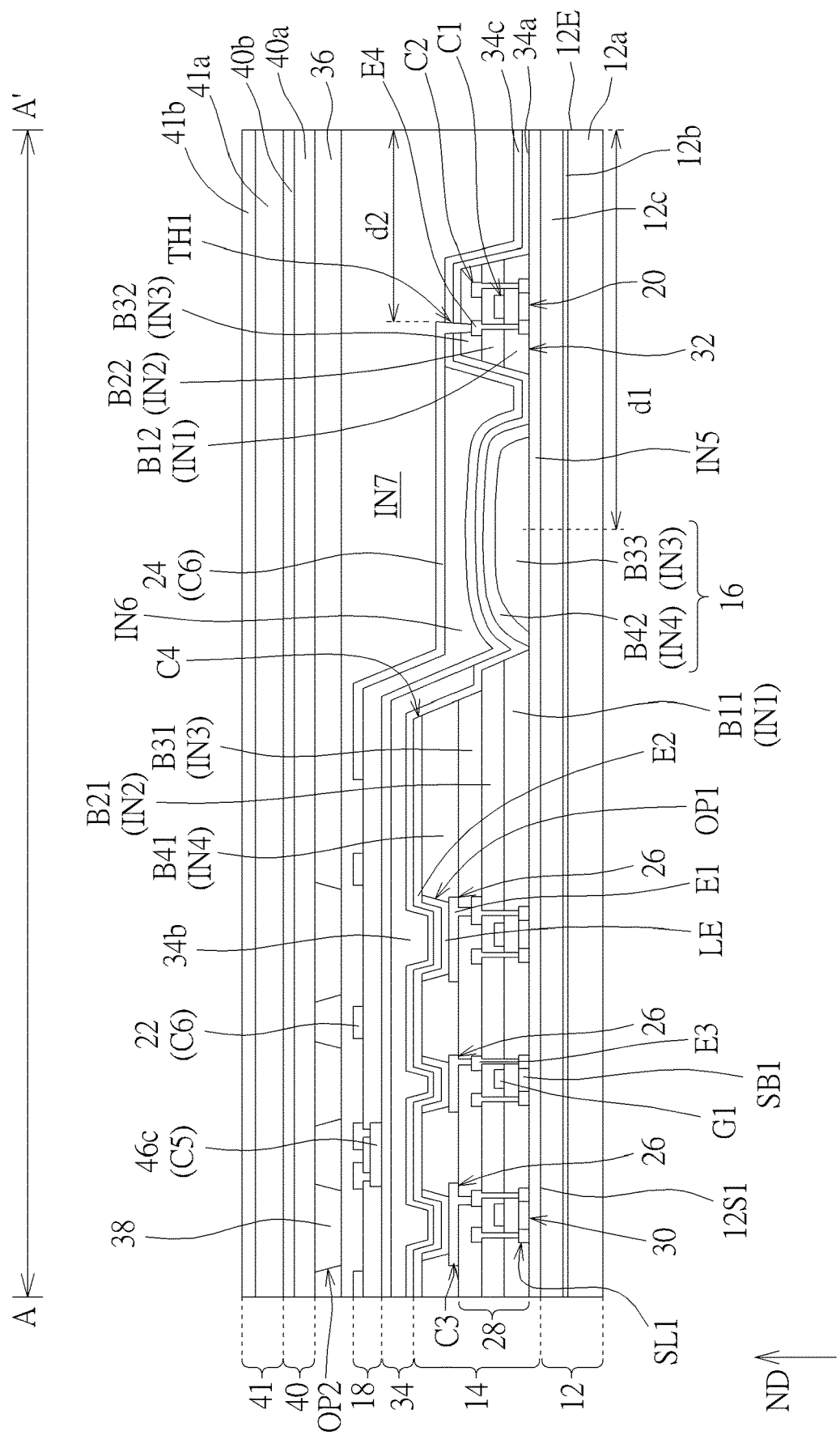
FIG. 2 schematically illustrates a cross-sectional view of FIG. 1 taken along a line A-A'.

Refer to FIG. 1 and FIG. 2. FIG. 1 schematically illustrates a top view of an electronic device according to a first embodiment of the present disclosure, and FIG. 2 schematically illustrates a cross-sectional view of FIG. 1 taken along a line A-A'. As shown in FIG. 1 and FIG. 2, the electronic device 1 may include a substrate 12, a circuit layer 14, an organic structure 16, and a sensing structure 18. The circuit layer 14 is disposed on the substrate 12 and includes a switch 20. The organic structure 16 is disposed on the substrate 12, and in the top view of the electronic device 1, the organic structure 16 may be adjacent to an edge 12E of the substrate 12. The sensing structure 18 is disposed on the circuit layer 14, and the sensing structure 18 includes a sensing unit 22 and a wire 24 electrically connected to the sensing unit 22, in which the sensing unit 22 may be configured to sense an input of a touch object. The wire 24 may cross over the organic structure 16 and be electrically connected to the switch 20, such that the sensing structure 18 may be electrically connected to the switch 20. In this embodiment, through the switch 20, a sensing mode of the sensing structure 18 may be switched from a first mode to a second mode or from the second mode to the first mode, so as to be configured to sense inputs of touch objects with different sizes to the electronic device 1. Specific structure and driving method of the electronic device will be described in detail below, but the present disclosure is not limited thereto. The touch objects may, for example, include a finger, an active stylus, a laser pointer, or other suitable objects. As disclosed herein, the top view of the electronic device 1 may be, for example, viewing the electronic device 1 along a direction opposite to a normal direction ND perpendicular to an upper surface 12S1 of the substrate 12.

In some embodiments, the substrate 12 may be a rigid or flexible substrate. A material of the substrate 12 may include, for example, glass, ceramics, sapphire, plastic or other suitable substrate materials. In some embodiments, the substrate 12 may be a single-layer or multilayer structure. As shown in FIG. 2, when the substrate 12 is a multilayer structure, the substrate 12 may be a composite layer, which may include, for example, an organic layer 12a, an inorganic layer 12b and an organic layer 12c stacked in sequence from bottom to top. The organic layer 12a and/or the organic layer 12c may, for example, include polyimide (PI) or other suitable materials. The inorganic layer 12b may, for example, include silicon oxide (Siox), silicon nitride (SiNx), silicon oxynitride (SiOxNy) or other suitable materials. It should be noted that, as shown in FIG. 1, the substrate 12 may have an active region AA and a non-active region PA. The active region AA may be configured to dispose at least one sensing unit (e.g., the sensing unit 22 shown in FIG. 5) and/or at least one electronic unit (e.g., the electronic unit 26 shown in FIG. 2) mentioned in the following contents. The active region AA may, for example, be defined by a region of a sensor formed by a plurality of sensing units or a display region where the electronic device 1 displays images. The non-active region PA may be configured to dispose the organic structure 16, the switch 20 and/or other elements, and the non-active region PA may be, for example, a region where the electronic device 1 cannot sense the touch object and/or a peripheral region where the electronic device 1 does not display images, but the active region AA of the present disclosure is not limited thereto.

As shown in FIG. 2, the circuit layer 14 may be, for example, a layer including at least one active element or at least one passive element. For example, the circuit layer 14 may include an electronic unit 26 and a pixel circuit 28 configured to control the electronic unit 26. The number of the electronic unit 26 in the circuit layer 14 may be, for example, one or more and may be adjusted according to requirements. The following description takes the circuit layer 14 including a plurality of electronic units 26 as an example, but not limited thereto. As mentioned herein, the pixel circuit 28 "controlling" the electronic units 26 may refer to that the pixel circuit 28 is able to receive external signals and drive the electronic units 26 according to the external signals, such that the electronic units 26 generate corresponding outputs, such as emitting light or emitting radio frequency electromagnetic waves.

In the embodiment of FIG. 2, the electronic units 26 may respectively be light emitting elements, but not limited thereto. The electronic units 26 may include diodes, such as organic light emitting diodes or inorganic light emitting diodes. In FIG. 2, the electronic units 26 are the organic light emitting diodes as an example, and each electronic unit 26 may include an electrode E1, a light emitting layer LE and an electrode E2 stacked in sequence. In an embodiment, the electronic units 26 may include light emitting elements for generating light of different colors, which may serve as sub-pixels of different colors, so that the electronic device 1 may display color images. For example, the electronic units 26 may be used to generate blue, red and green light respectively, but not limited thereto. In some embodiments, the electronic units 26 may generate light of the same color, but not limited thereto.

As shown in FIG. 2, the pixel circuit 28 may include at least one switch 30 electrically connected to at least one of the electronic units 26 and used to switch on/off the at least one of the electronic units 26. In the embodiment of FIG. 2, the number of the switch 30 in the pixel circuit 28 is plural as an example, and the switches 30 may be electrically connected to the electronic units 26 in a one-to-one correspondence, but not limited thereto. The number of the switches 30 corresponding to one of the electronic units 26 may be adjusted based on requirements. In some embodiments, the pixel circuit 28 may optionally further include other active elements, passive elements, wires or other suitable circuit elements and will not be detailed redundantly.

In the embodiment of FIG. 1 and FIG. 2, the circuit layer 14 may further include at least one switch structure 32 located between the organic structure 16 and the edge 12E of the substrate 12 in the top view of the electronic device 1, and the switch structure 32 may include a plurality of the switches 20 arranged along the edge 12E. In FIG. 1, the positions of the switch structures 32 may represent the positions of the switches 20, but not limited thereto. The circuit layer 14 may include three switch structures 32 respectively disposed between the organic structure 16 and a left edge 12E1 of the substrate 12, between the organic structure 16 and a right edge 12E2 of the substrate 12, and between the organic structure 16 and a lower edge 12E3 of the substrate 12, but not limited thereto. The switches as disclosed herein may also, for example, be referred to as switch elements, but not limited thereto. In some embodiments, the switches (e.g., the switches 20, the switches 30, and/or other switches described below) in the circuit layer 14 may include, for example, thin film transistors formed by thin film processes or metal oxide semiconductor field effect transistors (MOSFETs) formed by semiconductor processes.

A structure of the circuit layer 14 of this embodiment is further detailed below, but not limited thereto. In the embodiment of FIG. 2, the pixel circuit 28 and the switch structures 32 may include, for example, a semiconductor layer SL1, an insulating layer IN1, a conductive layer C1, an insulating layer IN2, a conductive layer C2, and an insulating layer IN3. The semiconductor layer SL1 may be disposed on the substrate 12 and include a plurality of semiconductor blocks SB1. Two end parts of one of the semiconductor blocks SB1 may be doped with dopant to serve as a drain region and a source region of a transistor respectively, and a part of the semiconductor block SB1 between the two end parts may serve as a channel region of the transistor. The insulating layer IN1 may be disposed on the semiconductor layer SL1 and may serve as a gate insulating layer of the transistor. The insulating layer IN1 may include a block B11 and at least one block B12 separated from each other and respectively located in the pixel circuit 28 and at least one of the switch structures 32. The conductive layer C1 is disposed on the insulating layer IN1 and includes a plurality of gate electrodes G1. One of the gate electrodes G1, the insulating layer IN1 and one of the semiconductor blocks SB1 may form one of the transistors, but not limited thereto. The transistors formed herein may include, for example, the switches 20 and/or the switches 30, but not limited thereto. Furthermore, the insulating layer IN2 may be disposed on the conductive layer C1, and the insulating layer IN2 may include a block B21 and at least one block B22 separated from each other and respectively located in the pixel circuit 28 and at least one of the switch structures 32. The block B11 and the block B21 may have a plurality of through holes respectively exposing the end parts of the semiconductor block SB1 of the pixel circuit 28, and the block B12 and the block B22 may have a plurality of through holes respectively exposing the end parts of the semiconductor block SB1 of the corresponding switch structure 32. The conductive layer C2 may be disposed on the insulating layer IN2 and may include a plurality of electrodes E3 in the pixel circuit 28 and a plurality of electrodes E4 in the corresponding switch structure 32. The electrodes E3 may be respectively disposed in the through holes of the block B11 and the block B21, so that the electronic units 26 may be electrically connected to the corresponding switches 30 through the corresponding electrodes E3. The electrodes E4 may be respectively disposed in the through holes of the block B12 and the block B22, so that the wires 24 may be electrically connected to the corresponding switches 20 through the corresponding electrodes E4. The insulating layer IN3 may be disposed on the insulating layer IN2 and the conductive layer C2. The insulating layer IN3 may be, for example, a planarization layer, such that an upper surface of the planarization layer may be a flat surface to facilitate the formation of the electronic units 26. For example, the insulating layer IN3 may include organic material or other suitable materials. In some embodiments, the insulating layer IN3 may include a block B31 and at least one block B32 separated from each other and respectively located in the pixel circuit 28 and at least one of the switch structures 32, but not limited thereto. In some embodiments, the number of the conductive layers and the number of the insulating layers of the pixel circuit 28 are not limited to the aforementioned and may further include other conductive layers and insulating layers according to other requirements. In some embodiments, the conductive layer C1, the conductive layer C2 and/or other conductive layers may optionally include other electrodes, signal lines (e.g., scan lines and/or data lines) or other conductive elements, but not limited thereto.

A material of the semiconductor layer SL1 may, for example, include silicon or metal oxide, such as low temperature polysilicon (LTPS), amorphous silicon (a-Si), indium gallium zinc oxide (IGZO) or other suitable semiconductors, but not limited thereto. In some embodiments, the semiconductor blocks SB1 of different transistors in the circuit layer 14 may include different materials. For example, the semiconductor block SB1 of one of the transistors may include LTPS, and the semiconductor block SB1 of another one of the transistors may include metal oxide, but not limited thereto. The insulating layer IN1, the insulating layer IN2 and/or other insulating layers of the pixel circuit 28 may for example include silicon oxide, silicon nitride, silicon oxynitride or other suitable inorganic materials. The conductive layer C1, the conductive layer C2 and/or other conductive layers of the pixel circuit 28 may include metal, in which the metal for example includes aluminum, molybdenum, copper, titanium, other suitable materials or a combination of at least two thereof.

As shown in FIG. 2, the circuit layer 14 may further include a conductive layer C3, an insulating layer IN4, and a conductive layer C4. The conductive layer C3 may be disposed on the insulating layer IN3 and may include the electrodes E1 of the electronic units 26. Moreover, the electrodes E1 may be separated and electrically insulated from each other. The insulating layer IN4 may be disposed on the insulating layer IN3 and the conductive layer C4. The insulating layer IN4 may have a plurality of openings OP1 respectively exposing the corresponding electrodes E1, and the light emitting layers LE of the electronic units 26 may be respectively disposed in the corresponding openings OP1 and separated from each other, such that each electronic unit 26 may be disposed corresponding to one of the openings OP1. Accordingly, the insulating layer IN4 may be, for example, a pixel defining layer. For example, the insulating layer IN4 may include an organic material or other suitable materials. The organic material of the insulating layer IN3 and the organic material of the insulating layer IN4 may be any suitable organic material, for example including acrylic, epoxy or resin. The conductive layer C4 may be disposed on the insulating layer IN4 and the light emitting layers LE and may include the electrodes E2 of the electronic units 26. In the embodiment of FIG. 2, the electrodes E2 may be connected to each other to form the conductive layer C4, but not limited thereto.

As shown in FIG. 2, the insulating layer IN3 may further include a block B33 disposed between the block B31 and the block B32 in the normal direction ND. In this embodiment, the insulating layer IN4 may optionally include a block B41 and a block B42 separated from each other, in which the block B41 is disposed on the block B31, and the block B42 is disposed on the block B33. In this case, the organic structure 16 may, for example, be formed of a stack of the block B33 and the block B42 and have a multilayer structure, but not limited thereto. In some embodiments, the organic structure 16 may be a single-layer structure and include one of the block B33 and the block B42, but not limited thereto. Alternatively, when the organic structure 16 is a multilayer structure, the organic structure 16 may further include other layers. In some embodiments, the organic structure 16 may, for example, have an arc-shaped upper surface. The single-layer structure or the multi-layer structure of the organic structure 16 may include any suitable organic material, such as acrylic, epoxy resin or resin.

In some embodiments, the circuit layer 14 may further include an insulating layer IN5 disposed between the substrate 12 and the pixel circuit 28. The insulating layer IN5 may for example serve as a buffer layer of the electronic device 1 to block moisture and/or oxygen from the outside, thereby reducing possibility of damage to elements in the electronic device 1 due to moisture and/or oxygen. In some embodiments, the insulating layer IN5 may be disposed between the organic structure 16 and the substrate 12 and/or between the switches 20 and the substrate 12, but not limited thereto.

In some embodiments, the structure of the circuit layer 14 is not limited to the aforementioned, and the numbers and layout structures of the insulating layers, the conductive layers, and the semiconductor layers may be adjusted as required. It should be noted that the structure of the circuit layer 14 shown in FIG. 2 is exemplary, and the present disclosure is not limited thereto.

As shown in FIG. 2, the electronic device 1 may further include an encapsulation layer 34 disposed on the electronic units 26 of the circuit layer 14 and used for blocking moisture and/or oxygen from the outside, thereby reducing the possibility of damage to the electronic units 26 and the pixel circuit 28 due to moisture and/or oxygen. The encapsulation layer 34 may include an inorganic layer 34a, an organic layer 34b, and an inorganic layer 34c stacked in sequence from bottom to top. In some embodiments, the inorganic layer 34a and the inorganic layer 34c of the encapsulation layer 34 may be disposed on the organic structure 16 and/or the switch structures 32.

As shown in FIG. 1 and FIG. 2, the organic structure 16 may surround the active region AA, and for example, may surround the electronic units 26. In the embodiment of FIG. 2, the organic structure 16 may be disposed between the block B11 and the block B12 of the insulating layer IN1 and between the block B21 and the block B22 of the insulating layer IN2, but not limited thereto. In some embodiments, at least one of the insulating layers (e.g., the insulating layer IN1 and/or the insulating layer IN2) of the pixel circuit 28 may not have the block but may be formed as one piece that completely disposed on (or cover) the substrate 12. In this case, the at least one insulating layer may be disposed between the organic structure 16 and the substrate 12, but not limited thereto.

It should be noted that, since the organic layer 34b in the encapsulation layer 34 has fluidity, disposing the organic structure 16 between the organic layer 34b and the edge 12E of the substrate 12 in the top view of the electronic device 1 may help to reduce or prevent the organic layer 34b located inside the organic structure 16 from overflowing to the edge 12E of the substrate 12 during manufacturing process. As shown in FIG. 1, in the top view of the electronic device 1, the organic structure 16 may be a closed ring shape, so as to facilitate blocking the organic layer 34b, thereby improving the protection of the encapsulation layer 34.

In some embodiments, as shown in FIG. 1, the circuit layer 14 may optionally include a gate driver 42 disposed between the sensing structure 18 and the organic structure 16 and may be electrically connected to the pixel circuit 28 as shown in FIG. 2, but not limited thereto.

As shown in FIG. 2, the sensing structure 18 may be disposed on the encapsulation layer 34 and may include at least one conductive layer for forming the sensing unit 22 and the wires 24. The number of the sensing units 22 in the sensing structure 18 may be, for example, plural, and the plural sensing units 22 may form the sensor for detecting the touch object touching or approaching the electronic device 1. For example, the sensor may sense touch or signals emitted from the active stylus, thereby detecting the position where the touch object touches or approaches the electronic device 1. FIG. 1 shows the region of the sensor 35, and the region of the sensor 35 may substantially define the active region AA, but not limited thereto. For example, a top view layout pattern of the sensor 35 may be shown in FIG. 3 and FIG. 4, and a top view pattern of one of the sensing units 22 may be shown in FIG. 5. Their specific description may refer to the following contents, but not limited thereto.

In the embodiment of FIG. 2, the sensing structure 18 may include a conductive layer C5, an insulating layer IN6, and a conductive layer C6 sequentially formed on the encapsulation layer 34, and the conductive layer C5, the insulating layer IN6 and the conductive layer C6 may form the sensing units 22 and the wires 24, but not limited thereto. As shown in FIG. 1 and FIG. 2, the sensing structure 18 may, for example, include a plurality of wires 24, but not limited thereto. Each wire 24 may be electrically connected to the corresponding switch 20, for example. In the top view of the electronic device 1, the wires 24 may extend from the sensing units 22 located inside the organic structure 16 to be on the switch structure 32 located outside the organic structure 16, and the inorganic layer 34a, inorganic layer 34b, and block B32 on the switches 20 may have a plurality of through holes TH1, such that the wires 24 may be electrically connected to the corresponding switches 20 through the corresponding through holes TH1, respectively.

It is noted that, in the top view of the electronic device 1, since the through holes TH1 are located between the organic structure 16 and the edge 12E of the substrate 12, the sensing units 22 located on the encapsulation layer 34 may be electrically connected to the switches 20 through the wires 24 and the through holes TH1 without affecting the protection effect of the encapsulation layer 34 located inside the organic structure 16. Since the switches 20 are located between the organic structure 16 and the edge 12E of the substrate 12 in the top view, a distance d1 between a center of the organic structure 16 and the edge 12E of the substrate 12 may be greater than a distance d2 between one of the through holes TH1 and the edge 12E of the substrate 12, as shown in FIG. 2. Because the sensing structure 18 of this embodiment may be electrically connected to the switches 20 in the circuit layer 14 without affecting the protective effect of the encapsulation layer 34, the sensing structure 18 may be formed on the encapsulation layer 34 instead of being formed on an extra substrate, thereby reducing a thickness and a weight of a whole of the electronic device 1. In addition, in the above structure, when the substrate 12 is, for example, a flexible substrate, the electronic device 1 may also be flexible, but not limited thereto.

In the embodiment of FIG. 2, the insulating layer IN6 may extend to be on the organic structure 16, and the wires 24 may be formed by the conductive layer C6 disposed on the insulating layer IN6, so that the insulating layer IN6 may be disposed between the organic structure 16 and the wires 24 to reduce disconnection of the wires 24 caused by uneven surfaces when the wires 24 cross over the organic structure 16. The insulating layer IN6 may, for example, include organic material or inorganic material. In some embodiments, when another insulating layer is disposed on the organic structure 16, the wires 24 may be formed of the conductive layer C5. In this case, the insulating layer disposed between the wires 24 and the organic structure 16 may include the organic material and/or the inorganic material.

As shown in FIG. 2, the electronic device 1 may further include an insulating layer IN7 disposed on the sensing structure 18 and the encapsulation layer 34. The insulating layer IN7 may, for example, include an organic material, such that the insulating layer IN7 may have a flat upper surface. In some embodiments, the electronic device 1 may optionally include a light shielding layer 36 and a color filter layer 38. The light shielding layer 36 may include a light shielding material, such as a black matrix, but not limited thereto. The light shielding layer 36 may, for example, have a plurality of openings OP2, and each opening OP2 corresponds to one of the electronic units 26 in the normal direction ND. In some embodiments, the color filter layer may include, for example, color filters of different colors, which may respectively correspond to the electronic units 26 of different colors in the normal direction ND, but not limited thereto.

In some embodiments, the electronic device 1 may optionally include an encapsulation layer 40 and/or a protection layer 41. The encapsulation layer 40 may be disposed on the light shielding layer 36 and the color filter layer 38, and the protection layer 41 may be disposed on the encapsulation layer 40, but not limited thereto. The encapsulation layer 40 may include, for example, an organic layer 40a and an inorganic layer 40b stacked in sequence from bottom to top. The organic layer 40a may, for example, include PI, polyethylene terephthalate (PET), adhesive or other suitable materials. The inorganic layer 40b may, for example, include silicon oxide, silicon nitride or other suitable materials. In some embodiments, the encapsulation layer 40 may include an alternating stack of a plurality of organic layers 40a and a plurality of inorganic layers 40b. The protection layer 41 may include, for example, an organic layer 41a and a hard coating layer 41b stacked in sequence from bottom to top. A material of the organic layer 41a may be, for example, the same as or similar to that of the organic layer 40a, but not limited thereto. The hard coating layer 41b may include polycarbonate (PC), acrylic or other suitable materials, for example. In some embodiments, the protection layer 41 may optionally include an ultra-thin glass (UTG), but not limited thereto.

In some embodiments, the encapsulation layer 40 and/or the protection layer 41 may be a substrate, and the light shielding layer 36 and the color filter layer 38 may be formed on the substrate first and then be attached to the sensing structure 18 through an adhesive layer, but not limited thereto.

In some embodiments, as shown in FIG. 1, at least a part of the electronic device 1 may be folded to the back of the electronic device 1 along a folding line BL, so as to reduce border widths respectively at a left side and a right side of the electronic device 1. For example, the substrate 12 may have a main portion P1 and at least one bent portion P2, in which the bent portion P2 is disposed on one side of the main portion P1. Moreover, the bent portion P2 and one of the switch structures 32 and the corresponding wires 24 disposed on the bent portion P2 may be bent to the back of the main portion P1 opposite to the sensor 35 along the folding line BL. In the embodiment of FIG. 1, the substrate 12 may have two bent portions P2 respectively disposed on a left side and a right side of the main portion P1, but not limited thereto.

Figure 3:
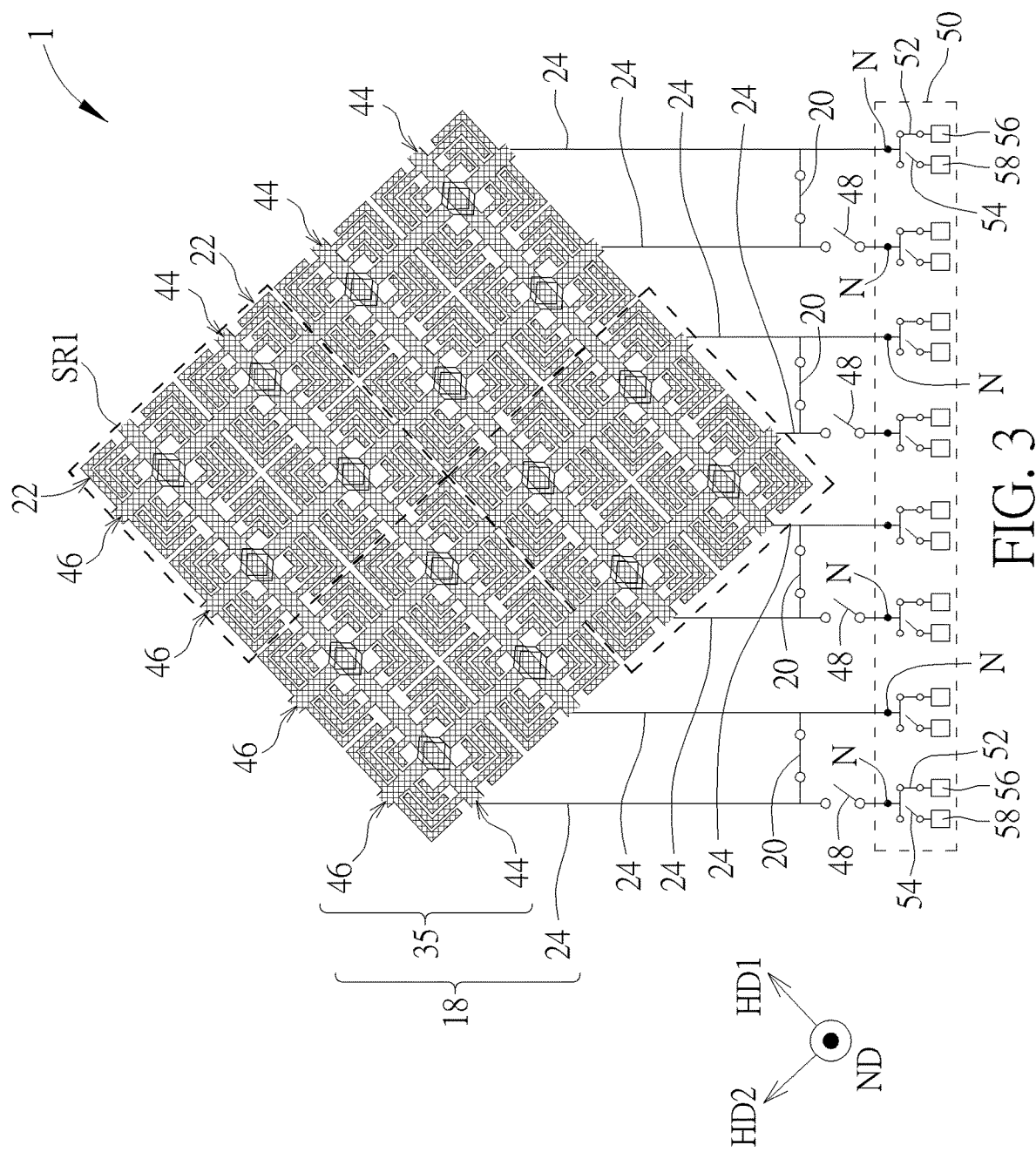
FIG. 3 schematically illustrates a top view of the electronic device operated in the first mode according to an embodiment of the present disclosure.
Figure 4:
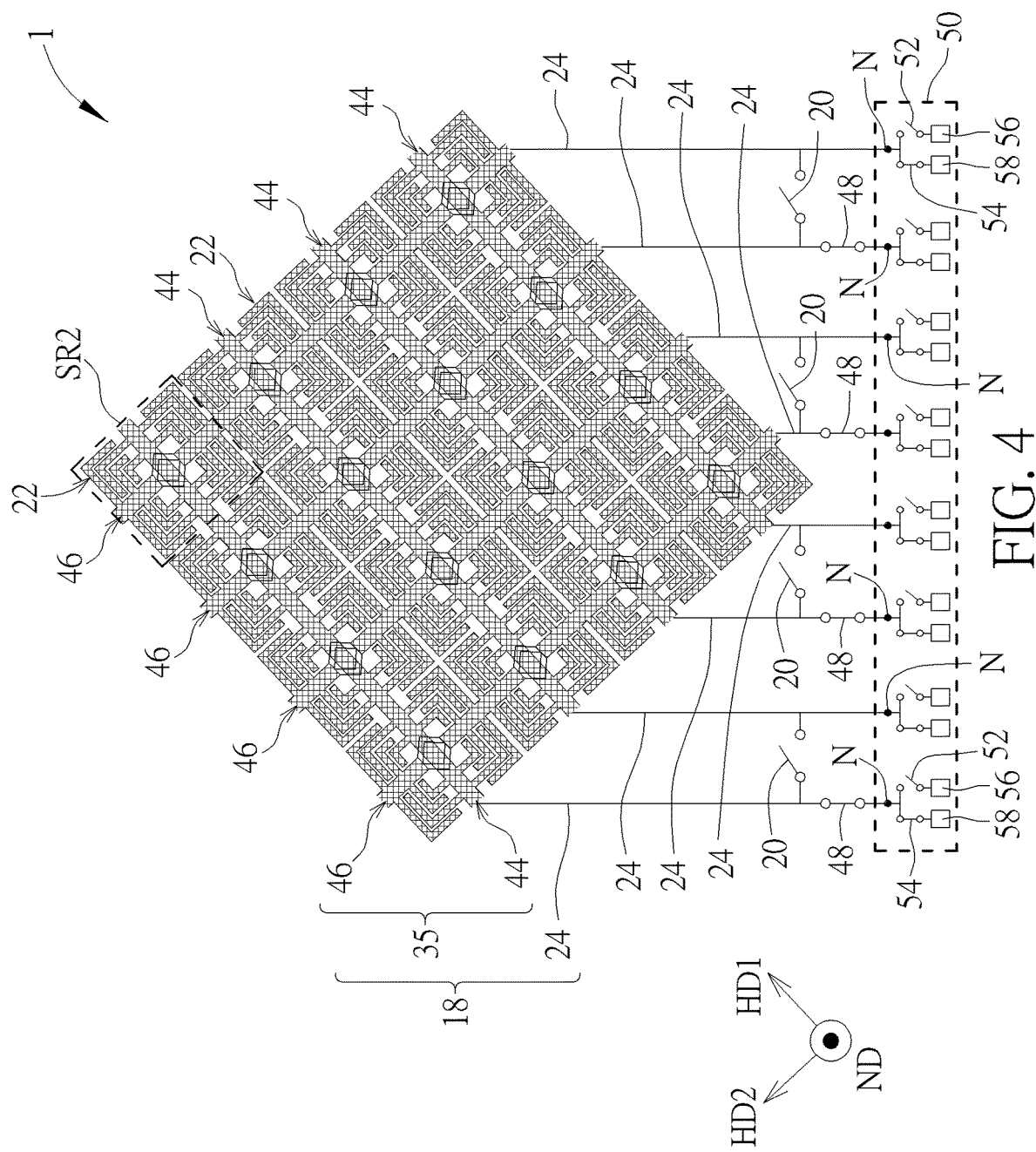
FIG. 4 schematically illustrates a top view of the electronic device operated in the second mode according to an embodiment of the present disclosure.

A top view structure and a sensing mode of the sensing structure 18 will be further detailed below, but not limited thereto. Refer to FIG. 3 and FIG. 4. FIG. 3 schematically illustrates a top view of the electronic device operated in the first mode according to an embodiment of the present disclosure, and FIG. 4 schematically illustrates a top view of the electronic device operated in the second mode according to an embodiment of the present disclosure. As shown in FIG. 3 and FIG. 4, in the top view of the electronic device 1, the sensor of the sensing structure 18 may include a plurality of first electrode strips 44 and a plurality of second electrode strips 46, in which the first electrode strips 44 may extend along a first direction HD1, and the second electrode strips 46 may extend along a second direction HD2. The first electrode strips 44 and the second electrode strips 46 are electrically insulated from each other, and the first electrode strips 44 may cross over the second electrode strips 46 to form a plurality of sensing units 22. The first direction HD1 and the second direction HD2 may be perpendicular to the normal direction ND and may not be parallel to each other. In some embodiments, the first direction HD1 may be perpendicular to the second direction HD2, but not limited thereto.

In the embodiment shown in FIG. 3 and FIG. 4, two adjacent first electrode strips 44 may form a first electrode strip group and may be electrically connected to each other through a corresponding one of the switches 20. Moreover, two adjacent second electrode strips 46 may form a second electrode strip group and may be electrically connected to each other through a corresponding one of the switches 20. The electronic device 1 may further include a plurality of switches 48 and a pad structure 50. One of the first electrode strips 44 of the first electrode strip group may be electrically connected to a node N of the pad structure 50 through one of the switches 48, and another one of the first electrode strips 44 of the first electrode strip group may be directly electrically connected to another node N of the pad structure 50. Similarly, one of the second electrode strips 46 of the second electrode strip group may be electrically connected to another node N of the pad structure 50 through one of the switches 48, and another one of the second electrode strips 46 of the second electrode strip group may be directly electrically connected to another node N of the pad structure 50. In some embodiments, the number of the first electrode strips 44 forming the first electrode strip group may not be limited to two but may be three or more, and/or the number of the second electrode strips 46 forming the second electrode strip group may not be limited to two but may be three or more. The top view layout pattern of the sensing structure 18 is not limited to FIG. 3 and FIG. 4 and may be one of structures of sensors of other types.

In the embodiment of FIG. 3 and FIG. 4, the pad structure 50 may include a plurality of switches 52, a plurality of switches 54, a plurality of first pads 56, and a plurality of second pads 58. One end of each of the switches 52 and one end of a corresponding one of the switches 54 may be electrically connected to the same node N, and each of the nodes N may be electrically connected to a corresponding one of the first electrode strips 44 or a corresponding one of the second electrode strips 46. Moreover, another end of each of the switches 52 may be electrically connected to a corresponding one of the first pads 56, and another end of each of the switches 54 may be electrically connected to a corresponding one of the second pads 58. In one embodiment, the first pads 56 may be used to respectively transmit driving signals of the first mode or receive sensing signals of the first mode, and the second pads 58 may be used to respectively transmit driving signals of the second mode and receive sensing signals of the second mode. The pad structure 50 of the present disclosure is not limited to the aforementioned and may be adjusted according to requirements.

Further, as shown in FIG. 3, the sensing structure 18 may include a plurality of first sensing regions SR1 in the first mode and may be configured to sense an input of touch in the first mode. The term "touch" mentioned herein may refer to a human body touching an upper surface of the electronic device 1, for example touching the electronic device 1 with a finger or other suitable parts. As an example, when the sensing structure 18 is in the first mode, the switches 20 may be in an on state, the switches 48 may be in an off state, the switches 52 may be in an on state, and the switches 54 may be in an off state. Accordingly, the first electrode strips 44 of the same first electrode strip group may be electrically connected to each other, and the second electrode strips 46 of the same second electrode strip group may be electrically connected to each other, so that one of the first sensing regions SR1 may be formed by one of the first electrode strip groups and one of the second electrode strip groups. One of the first electrode strip groups and the second electrode strip groups may receive one of the driving signals transmitted by the corresponding first pad 56 (or transmit one of the sensing signals), and another one of the first electrode strip groups and the second electrode strip groups may transmit the sensing signal to the corresponding first pad 56 (or transmit the driving signal). In other words, the first mode of the sensing structure 18 may be, for example, a mutual capacitive mode. Sizes of the first sensing regions SR1 may be determined according to the number of the first electrode strips in one of the first electrode strip groups and/or the number of the second electrode strips in one of the second electrode strip groups, but not limited thereto.

As shown in FIG. 4, the sensing structure 18 may further include a plurality of second sensing regions SR2 in the second mode and may be configured to sense another input of an input device in the second mode. The input device may include, for example, an active stylus, a laser pointer, or other suitable devices. For example, when the sensing structure 18 is switched to the second mode, the switches 20 may be in an off state, the switches 48 may be in an on state, the switches 52 may be in an off state, and the switches 54 may be in an on state, such that each of the first electrode strips 44 is electrically connected to the corresponding second pad 58, and each of the second electrode strips 46 is electrically connected to the corresponding second pad 58. Therefore, one of the second sensing regions SR2 may be formed by one of the first electrode strips 44 and one of the second electrode strips 46. In other words, an area of the second sensing region SR2 may be less than an area of the first sensing region SR1, so that a resolution of the sensing structure 18 in the second mode may be greater than that in the first mode. In this case, the sensing structure 18 may detect the touch object that has a small contact area with the electronic device 1 in the second mode. For example, the contact area of the input device with the electronic device 1 when the input device contacts the electronic device 1 may be less than the contact area of the human body with the electronic device 1 when the human body touches the electronic device 1. When the input device is the active stylus, the second pads 58 may transmit the driving signals and receive the sensing signals at different times. For example, the driving signals may be transmitted through the second pads 58 to be mutually induced with the active stylus, and then, the active stylus may receive a sensing signal to determine the position of the active stylus. In other words, the second mode of the sensing structure 18 may be, for example, a self-capacitive mode, but not limited thereto.

It should be noted that, the switches 20 may switch the sensing modes of the sensing structure 18, such that the same sensing structure 18 may be switched between the first mode and the second mode to have different sizes of the first sensing regions SR1 and the second sensing regions SR2. Accordingly, the first sensing regions SR1 may be substantially overlapped with the corresponding second sensing regions SR2. Since the first sensing regions SR1 and the second sensing regions SR2 are overlapped with each other, in order to operate the first sensing regions SR1 and the second sensing regions SR2 of the sensing structure 18 independently without affecting each other, the first mode and the second mode may be operated by the sensing structure 18 at different times.

Figure 5:
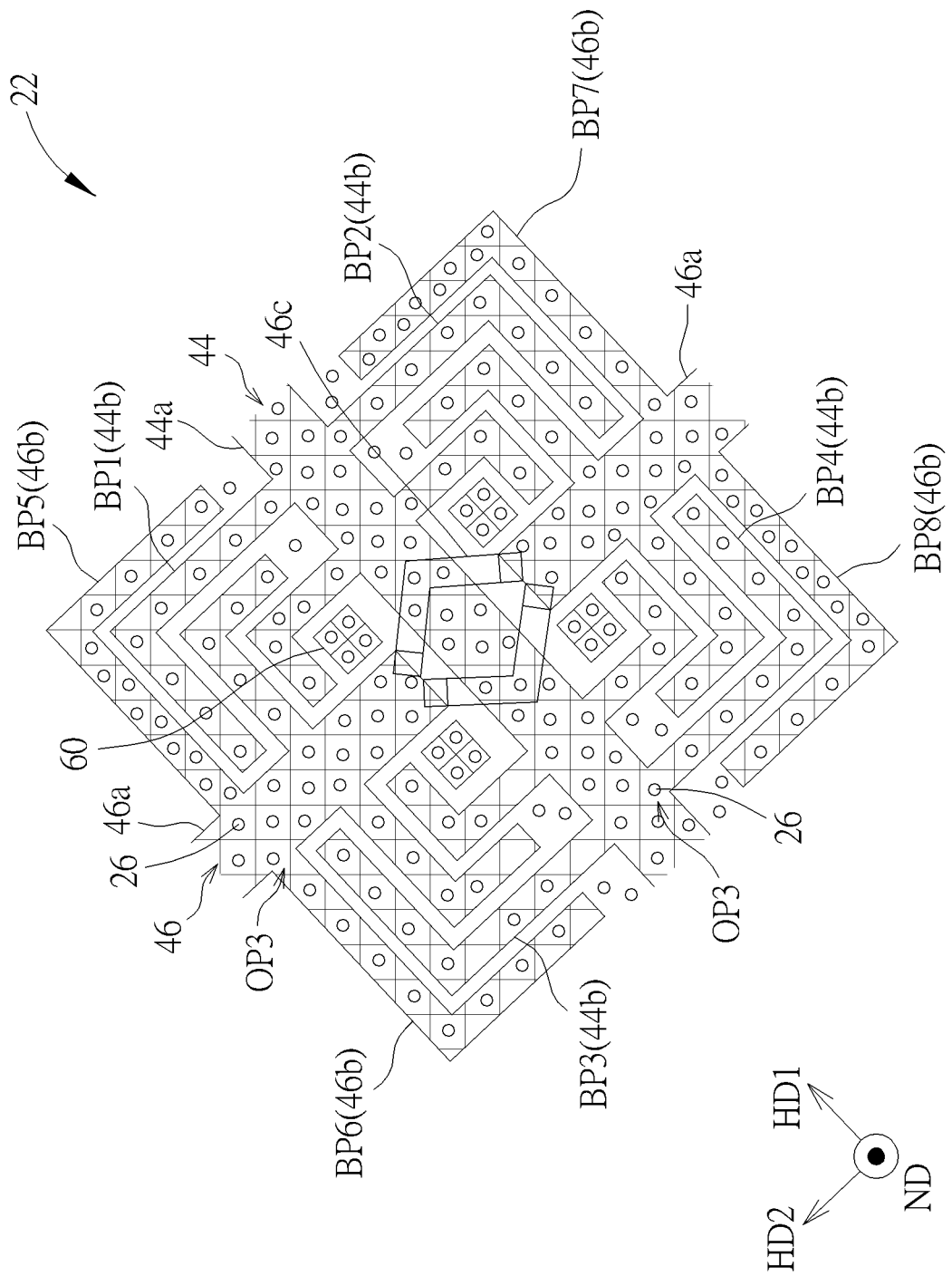
FIG. 5 schematically illustrates an enlarged top view of an electronic device corresponding to one sensing unit according to an embodiment of the present disclosure.

Refer to FIG. 5, which schematically illustrates an enlarged top view of an electronic device corresponding to one sensing unit according to an embodiment of the present disclosure. As shown in FIG. 3 to FIG. 5, the first electrode strips 44 may include a strip portion 44a and a plurality of branch portion groups 44b, in which the branch portion groups 44b may be connected to two opposite sides of the strip portion 44a extending along the first direction HD1. In the embodiment of FIG. 5, one of the branch portion group 44b may, for example, include two branch portions BP1, two branch portions BP2, two branch portions BP3, and two branch portions BP4, in which each of the branch portions BP1 is symmetrical to a corresponding one of the branch portions BP2 with respect to the strip portion 44a, and each of the branch portions BP3 may be symmetrical to a corresponding one of the branch portions BP4 with respect to the strip portion 44a. For example, a top view shape of the branch portion BP1, a top view shape of the branch portion BP2, a top view shape of the branch portion BP3 and/or a top view shape of the branch portion BP4 may be L-shaped or other suitable shapes, but not limited thereto. In some embodiments, the number of the branch portions BP1, the number of the branch portions BP2, the number of the branch portions BP3 and the number of the branch portions BP4 in the branch portion group 44b may be adjusted according to requirements and may be at least one, respectively.

One of the second electrode strips 46 may include a plurality of strip portions 46a, a plurality of branch portion groups 46b, and a plurality of bridge electrodes 46c, in which adjacent two of the strip portions 46a of each of the second electrode strips may be electrically connected to each other through at least one of the bridge electrodes 46c, and one of the branch portion groups 46b may be connected to two opposite sides of one of the strip portions 46a extending along the second direction HD2. In the embodiment of FIG. 5, the branch portion group 46b may include two branch portions BP5, two branch portions BP6, two branch portions BP7, and two branch portions BP8, in which each branch portion BP5 and a corresponding one of the branch portions BP6 may be symmetrical to each other with respect to one of the strip portions 46a, and each branch portion BP7 and a corresponding one of the branch portions BP8 may be symmetrical to each other with respect to another one of the strip portions 46a. For example, a top view shape of the branch portion BP5, a top view shape of the branch portion BP6, a top view shape of the branch portion BP7 and/or a top view shape of the branch portion BP8 may be L-shaped or other suitable shapes, but not limited thereto. In FIG. 5, the branch portions BP5 and the branch portions BP1 may be arranged alternately from the outside to the center of the corresponding sensing unit 22, and the branch portions BP6 and the branch portions BP3 may be arranged alternately from the outside to the center of the corresponding sensing unit 22. The branch portions BP7 and the branch portions BP2 may be arranged alternately from the outside to the center of the corresponding sensing unit 22, and the branch portions BP8 and the branch portions BP4 may be arranged alternately from the outside to the center of the corresponding sensing unit 22, but not limited thereto. In some embodiments, the number of the branch portions BP5, the number of the branch portions BP6, the number of the branch portions BP7, and the number of the branch portions BP8 in one of the branch portion groups 46b may be adjusted according to requirements and may be at least one, respectively. In some embodiments, the strip portions 44a and the branch portion groups 44b of the first electrode strips 44 and the strip portions 46a and the branch portion groups 46b of the second electrode strips 46 may be formed of one of the conductive layer C5 and the conductive layer C6 shown in FIG. 2, and the bridge electrodes 46c of the second electrode strips 46 may be formed of another one of the conductive layer C5 and the conductive layer C6 shown in FIG. 2.

As shown in FIG. 5, it should be noted that the first electrode strips 44 and the second electrode strips 46 of the sensing structure 18 may include metal meshes and may have a plurality of openings OP3, respectively. One of the openings OP3 may overlaps at least one of the electronic units 26. The term "opening" as disclosed herein may refer to a region of the sensing structure 18 that is not shielded by metal and allows light to pass through in the top view of the electronic device 1. The term "overlap" mentioned herein may refer to the opening OP3 overlapping the corresponding electronic unit 26 in the top view of the electronic device 1. Moreover, the first electrode strips 44 and the second electrode strips 46 may, for example, overlap the light shielding layer 36 to reduce visibility of the sensing structure 18. In some embodiments, when the electronic device 1 does not have the light shielding layer 36, upper surfaces of the metal meshes may optionally have an anti-reflection layer, but not limited thereto.

In some embodiments, one of the sensing units 22 may further include a dummy electrode 60 disposed between the branch portion group 44b of the first electrode strip 44 and one of the strip portions 46a of the second electrode strip 46. The dummy electrode 60 may for example include a metal mesh and may have the openings OP3, but not limited thereto. In some embodiments, the dummy electrode 60 may be formed of a conductive layer that forms the strip portions 44a of the first electrode strips 44, such as the conductive layer C6 shown in FIG. 2, but not limited thereto.

Figure 6:
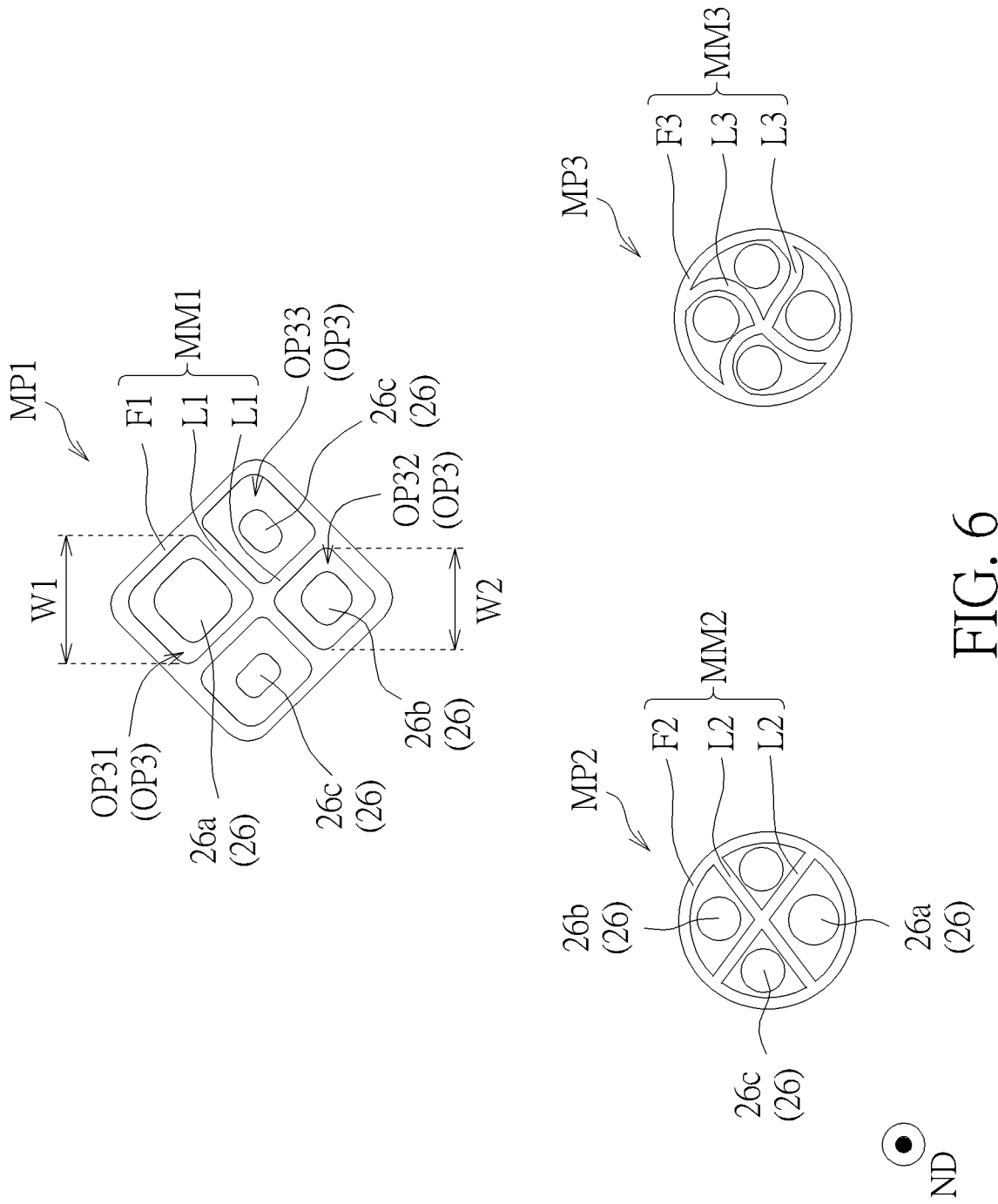
FIG. 6 schematically illustrates a top view of parts of the metal meshes and the corresponding electronic units according to an embodiment of the present disclosure.

Refer to FIG. 6, which schematically illustrates a top view of parts of the metal meshes and the corresponding electronic units according to an embodiment of the present disclosure. As shown in a part MP1 of FIG. 6, a metal mesh MM1 may include an outer frame F1 and a plurality of grid lines L1, in which the grid lines L1 are disposed in the outer frame F1 and connected to the outer frame F1 to form a plurality of the openings OP3. In the embodiment of FIG. 6, each of the electronic units 26 may be respectively disposed in a corresponding one of the openings OP3, but not limited thereto. In the part MP1, the grid line L1 may be, for example, a straight line, such that a shape of one of the openings OP3 may include, for example, a triangle, a rectangle or other suitable geometric shapes, but not limited thereto. In some embodiments, the shape of the opening OP3 may be adjusted according to the requirements.

In FIG. 6, the metal mesh MM1 may surround the electronic unit 26a, the electronic unit 26b, and the electronic unit 26c that generate light of different colors. For example, the electronic unit 26a may be used to generate blue light, the electronic unit 26b may be used to generate red light, and the electronic unit 26c may be used to generate green light, but not limited thereto. In some embodiments, the light emitting areas of the electronic units 26 may be different from each other. For example, the light emitting area of the electronic unit 26a may be greater than the light emitting area of the electronic unit 26b, and the light emitting area of the electronic unit 26b may be greater than the light emitting area of the electronic unit 26c, but not limited thereto. In some embodiments, the top view shape of one of the electronic units 26 may be, for example, a rectangle or other geometric shapes. In some embodiments, in the electronic units 26 surrounded by the metal mesh MM1, the number of the electronic units 26 for generating light of one color may be different from the number of the electronic units 26 for generating light of another color. For example, the number of the electronic units 26c may be greater than the number of the electronic units 26a and/or the number of the electronic units 26b. Also, as an example, one electronic unit 26a may correspond to two electronic units 26c and one electronic unit 26b, but not limited thereto. In some embodiments, the electronic unit 26a, the electronic units 26b, and the electronic unit 26c surrounded by the metal mesh MM1 may generate light of the same color, but not limited thereto.

In some embodiments, the openings OP3 surrounding the electronic units 26 may have different areas. For example, an area of the opening OP31 surrounding the electronic unit 26a may be greater than an area of the opening OP33 surrounding the electronic unit 26c. In this case, the area of the opening OP33 surrounding the electronic unit 26c may for example be greater than an area of the opening OP32 surrounding the electronic unit 26b. A ratio of the area of the greatest one of the opening OP31, the opening OP32, and the opening OP33 (e.g., the opening OP31) to the area of the smallest one (e.g., the opening OP32) may be greater than 1 and less than or equal to 25 (i.e., 1<(the area of the greatest one/the area of the smallest one)≤25), but not limited thereto.

In some embodiments, a width W1 of the opening OP31 along its diagonal line may be greater than a width W2 of the opening OP32 along its diagonal line, but not limited thereto. A ratio of the width W1 to the width W2 may be, for example, greater than 1 and less than or equal to 5 (i.e., 1<(the width W1/the width W2)≤5), but not limited thereto.

In some embodiments, at least one corner of one of the openings OP3 may have a curved shape in the top view, such as a rounded corner. In some embodiments, outer corners of the outer frame F1 may have a curved shape in the top view, such as rounded corners.

As shown in a part MP2 of FIG. 6, an outer frame F2 of a metal mesh MM2 may be, for example, a circle, and one of grid lines L2 of the metal mesh MM2 may be a straight line, but not limited thereto. In this case, the top view shape of the electronic unit 26 may be, for example, a circle or other geometric shapes. As shown in a part MP3 of FIG. 6, when an outer frame F3 of a metal mesh MM3 is still circular, one of grid lines L3 of the metal mesh MM3 may be a curve, but not limited thereto. The metal meshes and the electronic units in the aforementioned or following embodiments may use at least one of the part MP1, the part MP2, and the part MP3 in FIG. 6.

The electronic device of the present disclosure is not limited to the above-mentioned embodiment and may have other embodiments. In order to simplify the description, same elements in following other embodiments as the above-mentioned embodiment may use the same reference labels. In order to easily compare the differences between the above-mentioned embodiment and other embodiments, following contents describe the differences between the embodiments, and repeated parts will not be detailed again.

Figure 7:
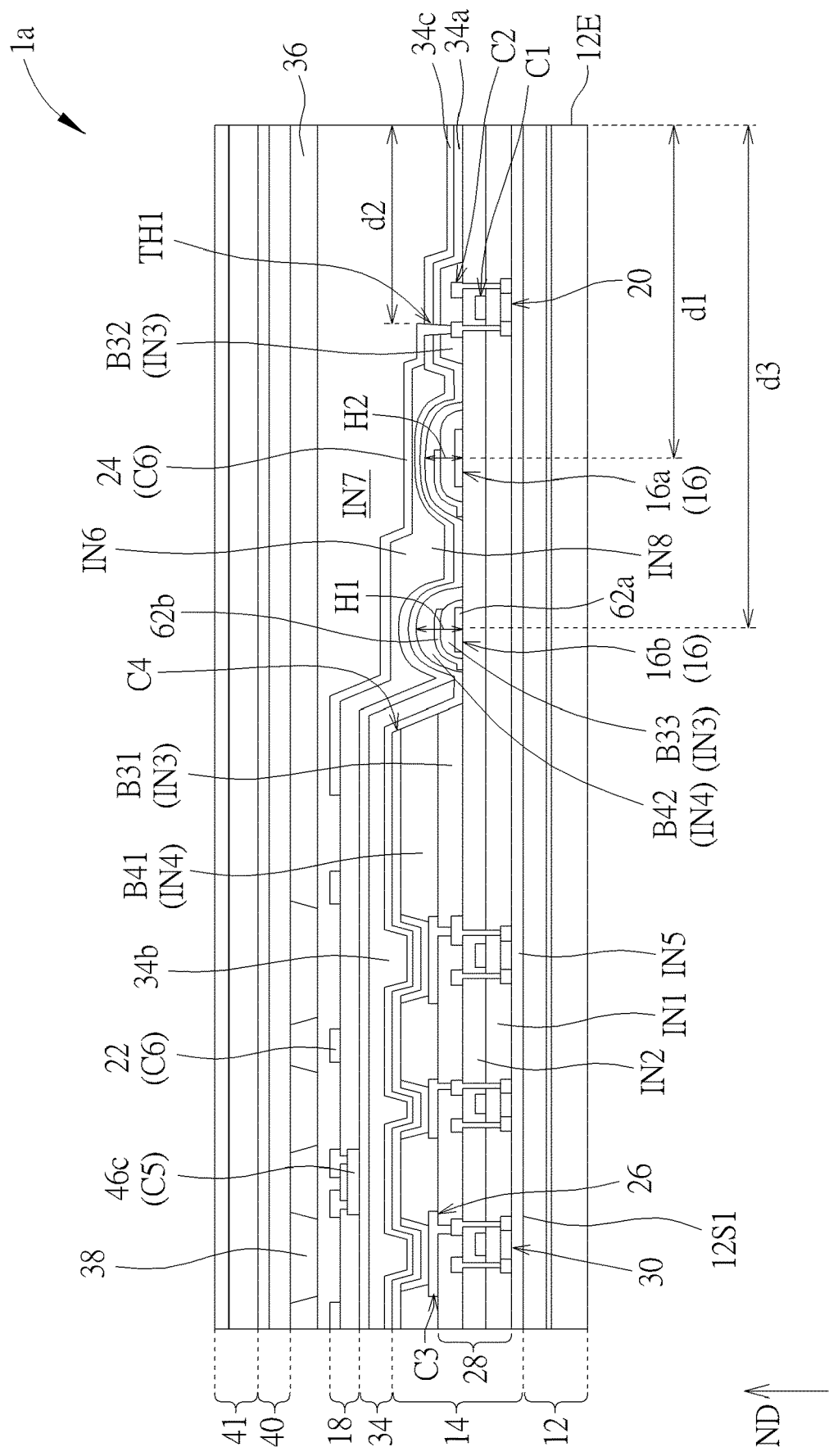
FIG. 7 schematically illustrates a cross-sectional view of an electronic device according to a second embodiment of the present disclosure.

Refer to FIG. 7, which illustrates schematically a cross-sectional view of an electronic device according to a second embodiment of the present disclosure. As shown in FIG. 7, in the electronic device 1a provided by this embodiment, the electronic device 1a may include a plurality of organic structures 16. In the embodiment of FIG. 7, the organic structures 16 may include an organic structure 16a and an organic structure 16b, in which the organic structure 16a and the organic structure 16b are separated from each other and arranged sequentially from the edge 12E of the substrate 12 toward the pixel circuit 28. In other words, a distance d3 between the organic structure 16b and the edge 12E of the substrate 12 may be greater than the distance d1 between the organic structure 16a and the edge 12E of the substrate 12. A difference between the distance d3 and the distance d1 may be, for example, greater than 20 micrometers (μm) and less than 8 μm (i.e., 20 μm<(the distance d3−the distance d1)<80 μm).

In some embodiments, a height H1 of the organic structure 16b may be different from a height H2 of the organic structure 16a. For example, the height H1 of the organic structure 16b may be greater than the height H2 of the organic structure 16a. In this case, the wires 24 crossing over the organic structure 16b and the organic structure 16a may have relatively flat stepped structures, thereby reducing the possibility of disconnection of the wires 24. In addition, disposing the higher organic structure 16b to be adjacent to the electronic units 26 may block the organic layer 34b as much as possible inside the organic structure 16b to improve the protection effect of the encapsulation layer 34. In some embodiments, the height H1 of the organic structure 16b and the height H2 of the organic structure 16a in FIG. 7 may be applied to any one of the aforementioned or following embodiments.

In some embodiments, the circuit layer 14 may include at least one wire (e.g., a wire 62a and a wire 62b shown in FIG. 7) disposed in one of the organic structures 16. For example, the wire may be disposed between one of the organic structures 16 and the insulating layer IN2 or between any two of the insulating layers in one of the organic structures 16. In this case, the wire may, for example, cross over at least one of the organic structures 16 or along one of the organic structures 16. In the embodiment of FIG. 7, the wire 62a may be disposed between one of the organic structures 16 and the insulating layer IN2 and may be formed of the conductive layer C2, but not limited thereto. In some embodiments, the wire 62b may be disposed between the block B33 and the block B42 of one of the organic structures 16 and may be formed of the conductive layer C3, but not limited thereto. In this case, the wire 62b may cross the wire 62a, but not limited thereto. In some embodiments, the wire 62a and/or the wire 62b in FIG. 7 may be applied to any one of the aforementioned or following embodiments.

In the embodiment of FIG. 7, the insulating layer IN1 and the insulating layer IN2 may not have the block but may be formed as one piece that completely disposed on (or cover) an upper surface 12S1 of the substrate 12, so that the insulating layer IN1 and the insulating layer IN2 may be located between the organic structures 16 and the substrate 12. In this case, the organic structures 16 may be directly disposed on the insulating layer IN2, but not limited thereto. In addition, other parts of the electronic device 1a in FIG. 7 may refer to the structure of the aforementioned or following embodiments and will not be detailed redundantly herein. In some embodiments, the electronic device 1a shown in FIG. 7 may use the structure of the insulating layer IN1 and the insulating layer IN2 having the blocks as shown in FIG. 2.

Figure 8:
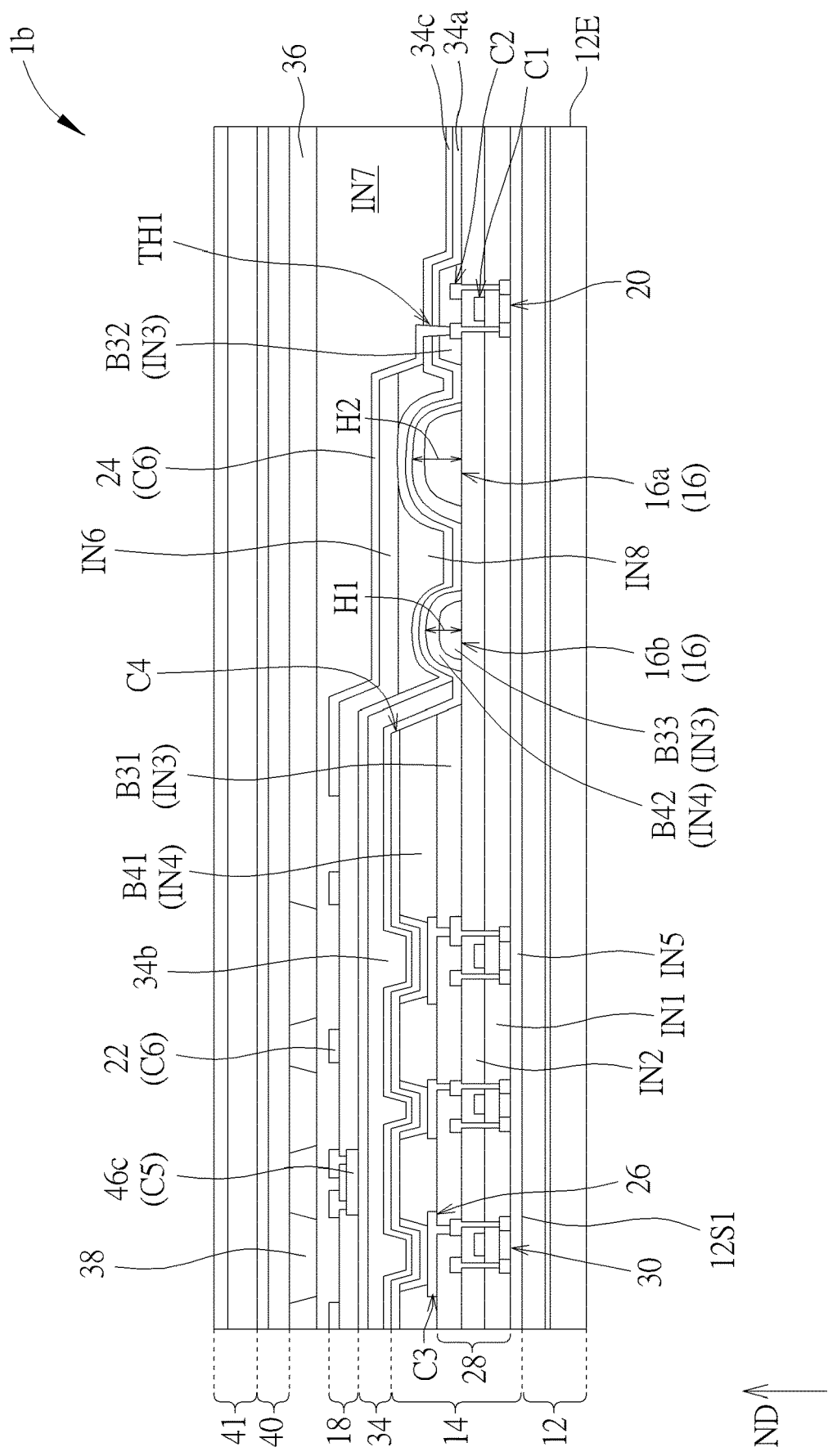
FIG. 8 schematically illustrates a cross-sectional view of an electronic device according to a third embodiment of the present disclosure.

Refer to FIG. 8, which schematically illustrates a cross-sectional view of an electronic device according to a third embodiment of the present disclosure. As shown in FIG. 8, in the electronic device 1b provided by this embodiment, the height H2 of the organic structure 16a adjacent to the edge 12E of the substrate 12 may be greater than the height H1 of the organic structure 16b adjacent to the electronic units 26. In this case, the lower organic structure 16b may block at least a portion of the organic layer 34b, and the upper organic structure 16a may ensure that the organic layer 34b does not overflow to the edge 12E of the substrate 12. In the embodiment of FIG. 8, the electronic device 1b may further include an insulating layer IN8 disposed between the organic structures 16 and the wires 24, and the insulating layer IN8 may be used to reduce the disconnection of the wires 24 caused by uneven surfaces when the wires 24 crosses over the organic structures 16. The insulation layer IN8 may be, for example, a flat layer with a flat upper surface, so as to reduce disconnection of the wires 24. The insulating layer IN8 may, for example, include organic materials or other suitable materials. In the embodiment of FIG. 8, the insulating layer IN8 may be located between the inorganic layer 34c and the insulating layer IN6, but not limited thereto. The insulating layer IN8 of FIG. 8 may be applied to any one of the aforementioned or following embodiments. In some embodiments, the electronic device 1b of FIG. 8 may use the structure of the insulating layer IN1 and the insulating layer IN2 having the blocks as shown in FIG. 2. Other parts of the electronic device 1b in FIG. 8 may refer to the structure of any one of the aforementioned or following embodiments and will not be detailed redundantly herein.

Figure 9:
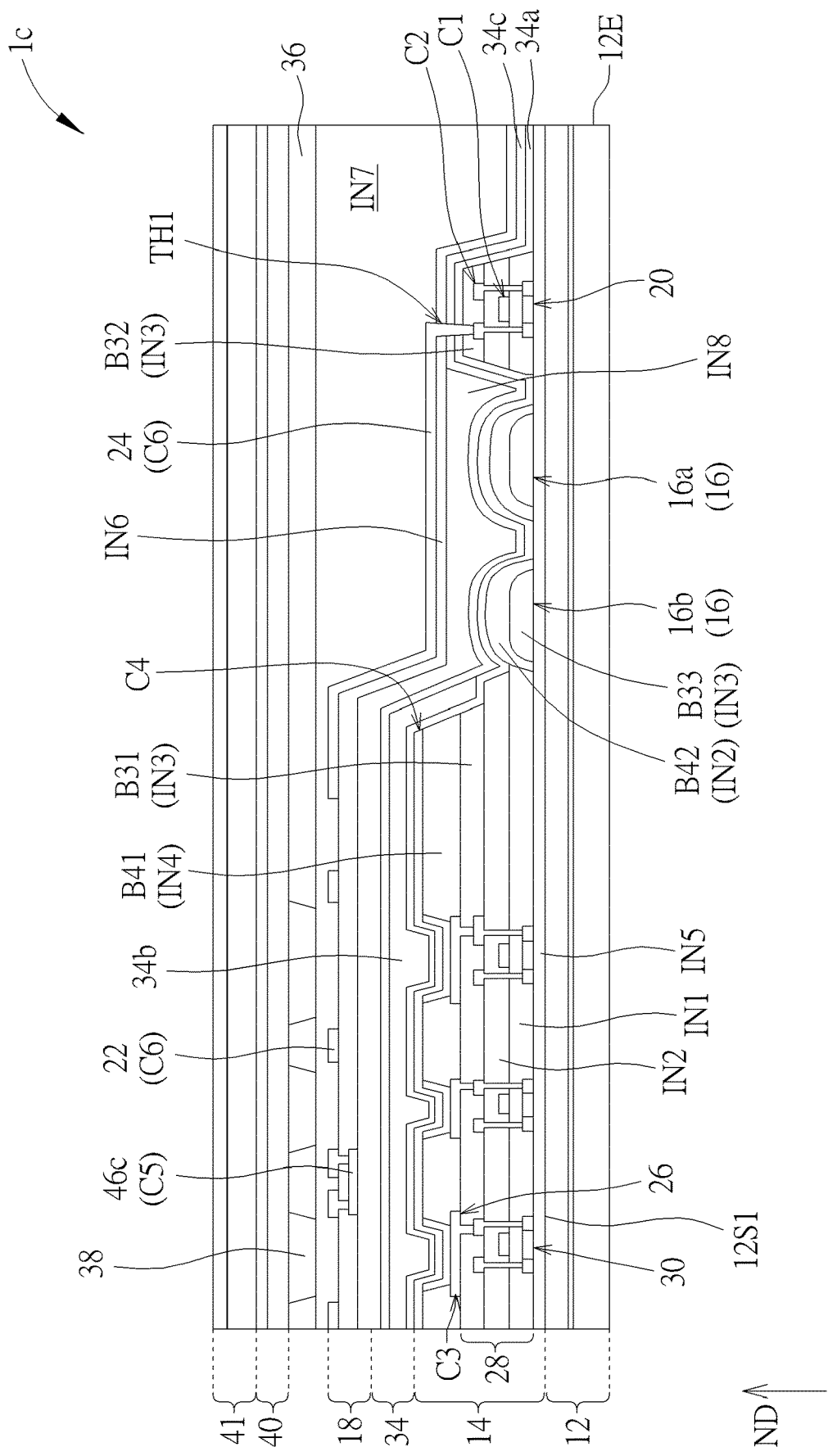
FIG. 9 schematically illustrates a cross-sectional view of an electronic device according to a fourth embodiment of the present disclosure.

Refer to FIG. 9, which schematically illustrates a cross-sectional view of an electronic device according to a fourth embodiment of the present disclosure. As shown in FIG. 9, in the electronic device 1c provided by this embodiment, the insulating layer IN8 may be disposed on the electronic units 26. For example, the insulating layer IN8 may extend from the active region (e.g., the active region AA shown in FIG. 1) to be on the organic structures 16. In the embodiment of FIG. 9, the organic structures 16 may be directly disposed on the insulating layer IN5, but not limited thereto. In some embodiments, the insulating layer IN1 and the insulating layer IN2 in FIG. 9 may use the structure of the insulating layer IN1 and the insulating layer IN2 disposed between the organic structures 16 and the substrate 12 as shown in FIG. 8. In some embodiments, the insulating layer IN6 may optionally extend to the edge 12E of the substrate 12. In such case, the through holes TH1 may penetrate through the insulating layer IN6, but not limited thereto. Other parts of the electronic device 1c in FIG. 9 may refer to the structure of any one of the aforementioned or following embodiments and will not be detailed redundantly herein.

Figure 10:
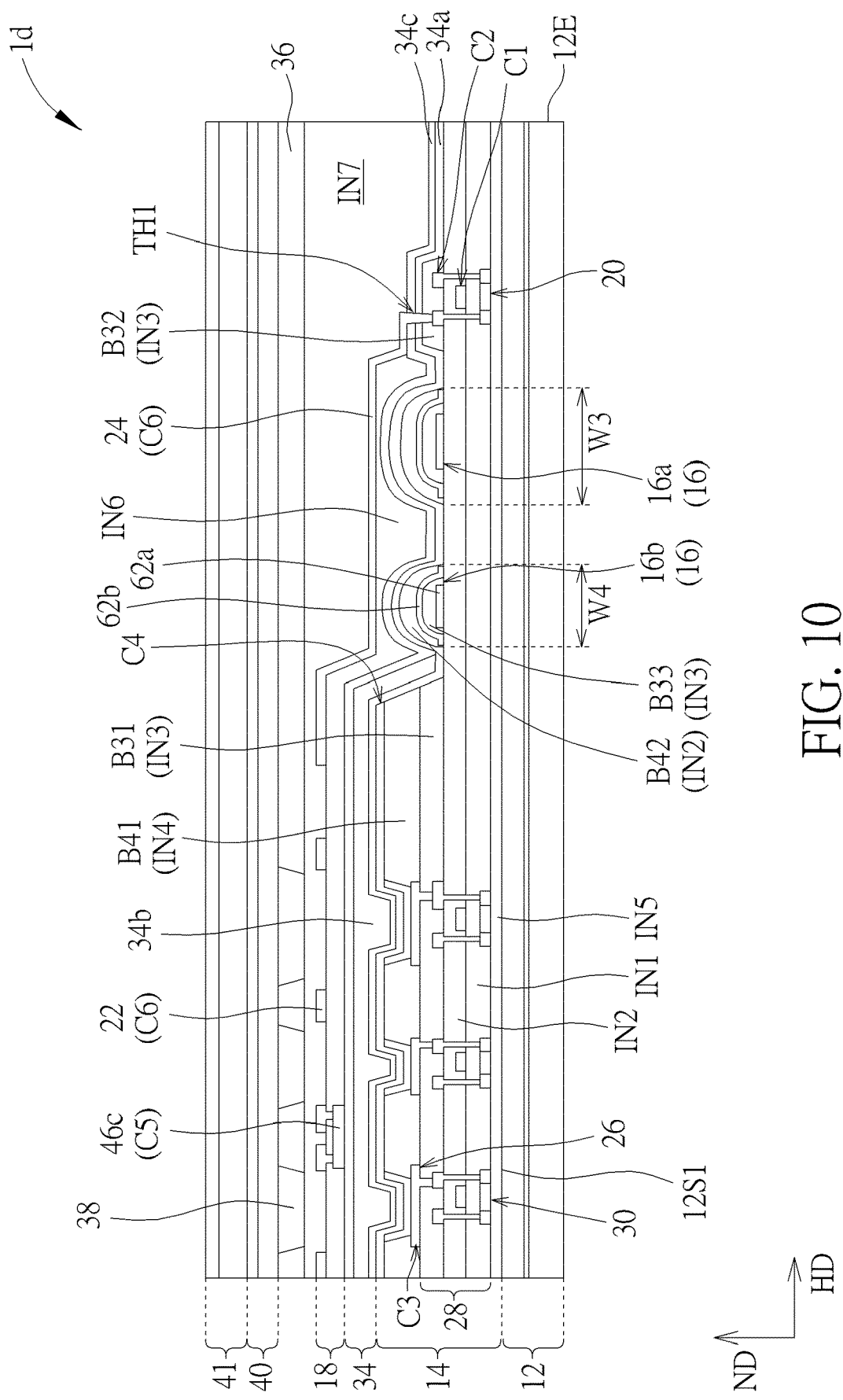
FIG. 10 schematically illustrates a cross-sectional view of an electronic device according to a fifth embodiment of the present disclosure.

Refer to FIG. 10, which schematically illustrates cross-sectional view of an electronic device according to a fifth embodiment of the present disclosure. As shown in FIG. 10, in the electronic device 1d provided by this embodiment, a width W3 of the organic structure 16a in a horizontal direction HD may be greater than a width W4 of the organic structure 16b in the horizontal direction HD. The horizontal direction HD may be, for example, perpendicular to an extending direction of the organic structure 16a and the organic structure 16b in the top view of the electronic device 1d. In some embodiments, a ratio of the width W3 to the width W4 may be greater than or equal to 1.1 and less than or equal to 1.5 (i.e., 1.1≤ (the width W3/the width W4)≤1.5). In FIG. 10, the electronic device 1d may optionally use the structure of the wire 62a and the wire 62b as shown in FIG. 7, but not limited thereto. Other parts of the electronic device 1d in FIG. 10 may refer to the structure of any one of the aforementioned or following embodiments and will not be repeated herein.

Figure 11:
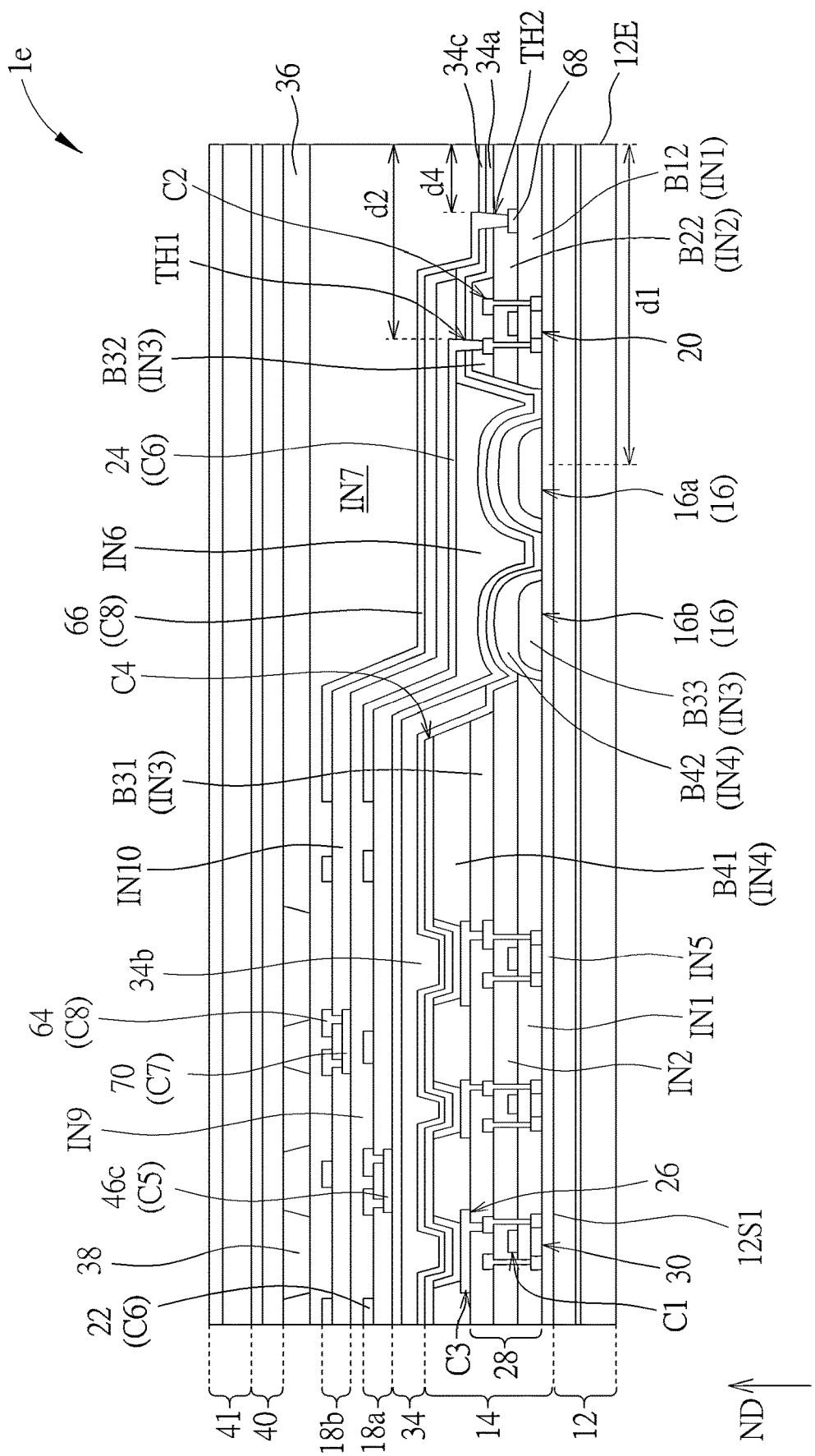
FIG. 11 schematically illustrates a cross-sectional view of an electronic device according to a sixth embodiment of the present disclosure.

Refer to FIG. 11, which schematically illustrates a cross-sectional view of an electronic device according to a sixth embodiment of the present disclosure. As shown in FIG. 11, in the electronic device 1e provided by this embodiment, the electronic device 1e may include a plurality of sensing structures sequentially arranged on the circuit layer 14 and used to detect inputs of different touch objects respectively. In the embodiment of FIG. 11, the electronic device 1e may include a sensing structure 18a, an insulating layer IN9, and a sensing structure 18b sequentially disposed on the circuit layer 14, in which the insulating layer IN9 may electrically insulate the sensing structure 18a from the sensing structure 18b. For example, the sensing structure 18a may be configured to sense the input of the input device, and the sensing structure 18b may be configured to sense the input of touch. In other words, a resolution of the sensing structure 18a may be greater than a resolution of the sensing structure 18b, for example. In some embodiments, the sensing structure 18b may be disposed between the circuit layer 14 and the sensing structure 18a.

As shown in FIG. 11, the sensing structure 18a may be, for example, the same as the sensing structure 18 shown in FIG. 2, so it will not be repeated herein. The sensing structure 18b may include a plurality of sensing units 64 and a plurality of wires 66, and in FIG. 11, one of the sensing units 64 and one of the wires 66 are taken as an example, but not limited thereto. The sensing unit 64 may be disposed in the active region (e.g., the active region AA of FIG. 1), and the wire 66 may be electrically connected to the sensing unit 64. The electronic device 1e may further include at least one pad 68 used for transmitting at least one driving signal to the sensing unit 64 or receiving at least one sensing signal from the sensing unit 64. The wire 66 may extend from the active region and cross over the organic structures 16 and one of the switches 20 to be electrically connected to the pad 68. In the embodiment of FIG. 11, the pad 68 may be disposed between the block B12 of the insulating layer IN1 and the block B22 of the insulating layer IN2, and the inorganic layer 34c, the inorganic layer 34a, and the insulating layer IN2 may have a through hole TH2, so that the wire 66 may be electrically connected to the pad 68 through the through hole TH2. Accordingly, the sensing unit 64 may transmit or receive signals through the wire 66 and the pad 68.

It should be noted that, in the top view of the electronic device 1, the pad 68 may for example be located between the switch 20 and the edge 12E of the substrate 12, so that the distance d2 between the through hole TH1 and the edge 12E of the substrate 12 may be greater than the distance d4 between the through hole TH2 and the edge 12E of the substrate 12. With this design, the possibility of damage to the switch 20 due to its proximity to the edge 12E may be reduced.

The sensing structure 18b may include at least one conductive layer for forming the sensing unit 64 and the wire 66. In the embodiment of FIG. 11, the sensing structure 18b may include a conductive layer C7, an insulating layer IN10 and a conductive layer C8 to form the sensing unit 64, the wire 66, and the bridge electrode 70, but not limited thereto. For example, one of the conductive layer C7 and the conductive layer C8 may form the bridge electrode 70, and another one of them may form the sensing unit 64 and the wire 66. In this case, the structures of the sensing unit 64, the wire 66 and the bridge electrode 70 may refer to the above contents mentioned in FIG. 3 to FIG. 5, but not limited thereto. In some embodiments, the top view layout pattern of the sensing structure 18b may be different from the top view layout pattern of the sensing structure 18a or may be one of structures of sensors of other types.

As shown in FIG. 11, the bridge electrode 46c of the sensing structure 18a and the bridge electrode 70 of the sensing structure 18b may be staggered, for example. In other words, the bridge electrode 46c and the bridge electrode 70 may be separated from each other and may not be overlapped with each other in the top view of the electronic device 1e, such that signal interference between the sensing structure 18a and the sensing structure 18b may be reduced. Other parts of the electronic device 1e of FIG. 11 may refer to the structure of any one of the aforementioned or following embodiments and will not be repeated herein.

Figure 12:
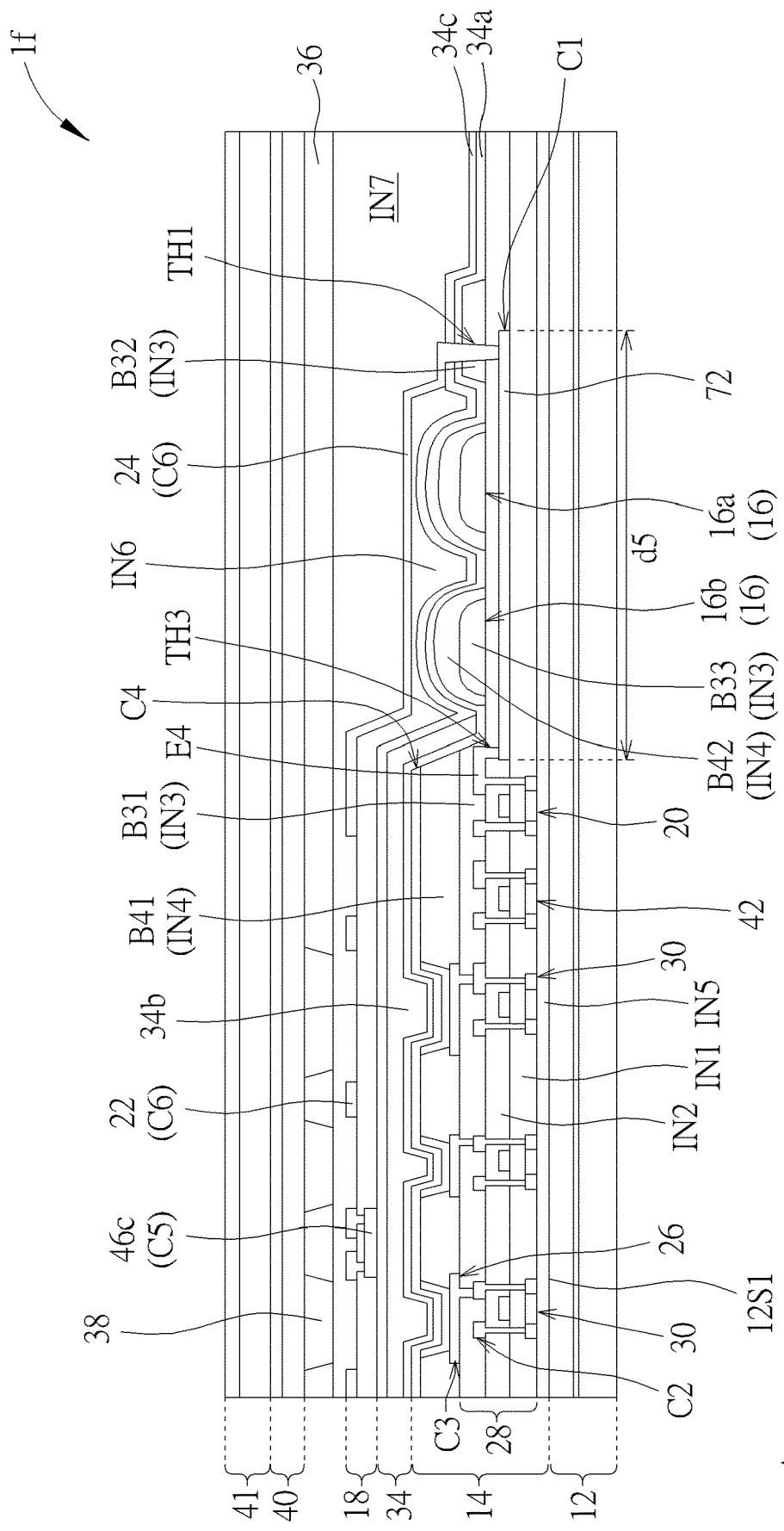
FIG. 12 schematically illustrates a cross-sectional view of an electronic device according to a seventh embodiment of the present disclosure.

Refer to FIG. 12, which schematically illustrates cross-sectional view of an electronic device according to a seventh embodiment of the present disclosure. As shown in FIG. 12, in the electronic device 1f provided by this embodiment, the organic structures 16 may be disposed between the switch 20 and the edge 12E of the substrate 12. In other words, the switch 20 may be located inside the organic structures 16 in the top view of the electronic device 1f. In this case, the circuit layer 14 may further include at least one wire 72 disposed under the organic structures 16 and electrically connected to the wire 24 and the switch 20. One end of the wire 72 may be electrically connected to one end of the switch 20, and the other end of the wire 72 may be electrically connected to the wire 24. In the embodiment of FIG. 12, the through hole TH1 may be still located between the organic structures 16 and the edge 12E of the substrate 12 in the top view of the electronic device 1f, and the through hole TH1 may expose a part of the wire 72 adjacent to the edge 12E, so that the wire 24 extending to the through hole TH1 may be electrically connected to the wire 72 through the through hole TH1. For example, the wire 72 may be formed of the conductive layer C1 and located between the insulating layer IN1 and the insulating layer IN2. In this case, the through hole TH1 may penetrate through the inorganic layer 34c, the inorganic layer 34a, the block B32 of the insulating layer IN3, and the insulating layer IN2, but not limited thereto. The insulating layer IN2 may further have a through hole TH3 exposing another part of the wire 72 adjacent to the switch 20, so that the electrode E4 of the conductive layer C2 may be electrically connected to the wire 72 through the through hole TH3. It should be noted that, through the above-mentioned structure, the wire 24 and the wire 72 may be disposed on and below the organic structures 16, respectively, and the wire 24 and the wire 72 for electrically connected to the sensing units 22 and the switch 20 respectively may overlap the organic structures 16 in the top view of the electronic device 1f. Accordingly, the sensing units 22 may be electrically connected to the switch 20 located inside the organic structures 16 through the wire 24 and the wire 72 without affecting the encapsulating effect of the encapsulation layer 34. Since the switch 20 may be disposed inside the organic structures 16, the switch 20 may be disposed between the encapsulation layer 34 and the substrate 12 to reduce the possibility of damage to the switch 20 due to moisture and/or oxygen. In some embodiments, the wire 72 may be formed of another conductive layer, and the layer through which the through hole TH1 penetrates may be determined according to the position of the wire 72.

In one embodiment, a length d5 of the wire 72 in the horizontal direction HD may be greater than or equal to 30 μm and less than or equal to 1000 μm (i.e., 30 μm≤the length d5≤1000 μm), or the length d5 may be greater than or equal to 30 μm and less than or equal to 300 μm (i.e., 30 μm≤the length d5≤300 μm). It should be noted that when the length d5 of the wire 72 is too long, the through hole TH1 is easy to be too close to the edge 12E of the substrate 12, so that the wire 24 is easily damaged by moisture and/or oxygen. When the length d5 of the wire 72 is too short, a space between the through hole TH1 and the switch 20 for disposing the organic structures 16 is easy to be insufficient, thereby reducing the possibility of the organic layer 34b being blocked by the organic structures 16. In this situation, the organic layer 34b is easy to overflow to the outside of the organic structure 16, thereby affecting the encapsulating effect of the encapsulation layer 34. Through the above range of the length d5 of the wire 72, the distance between the through hole TH1 and the edge 12E of the substrate 12 may be increased, and/or the overflow of the organic layer 34b may be reduced.

Figure 17:
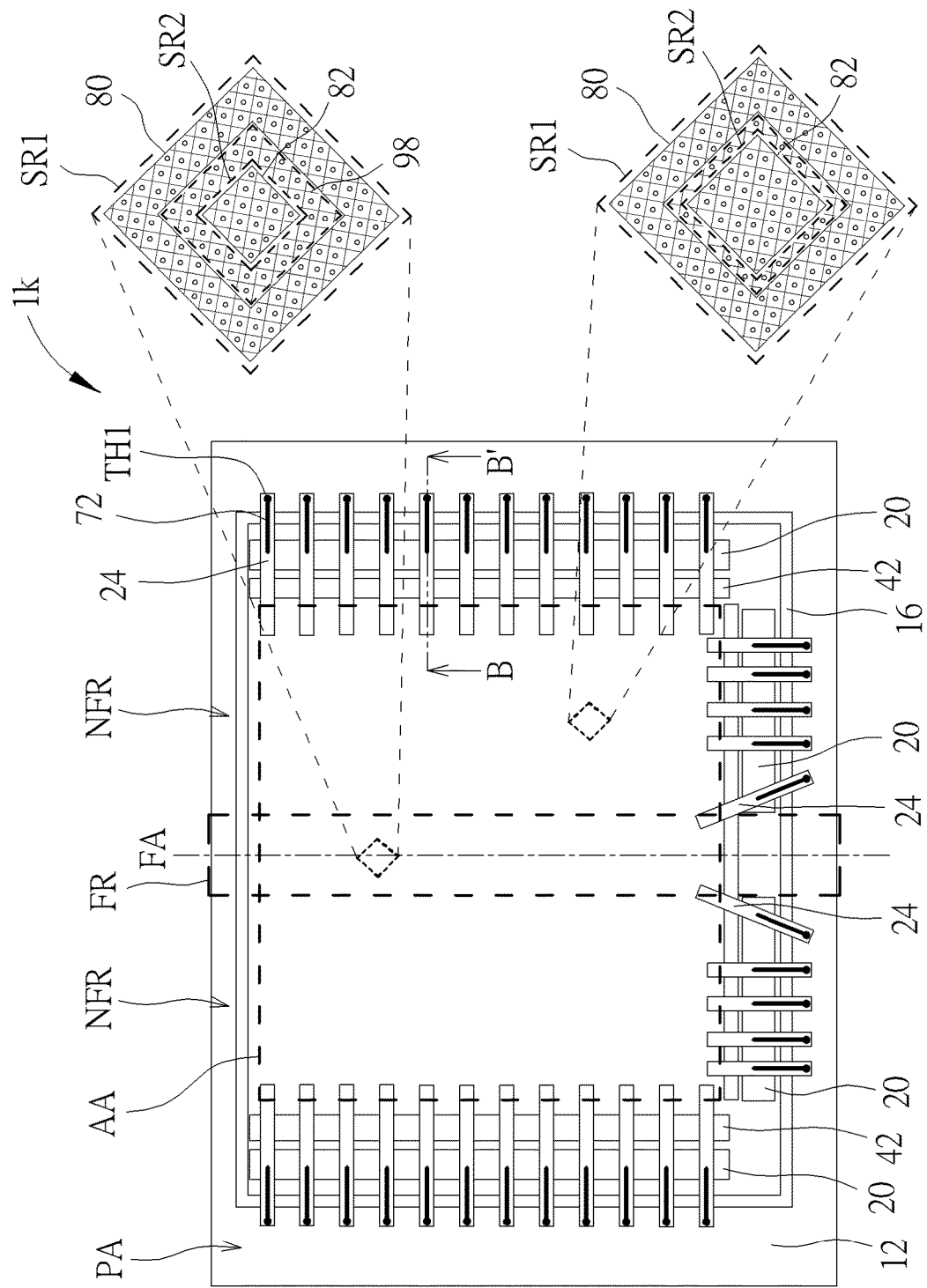
FIG. 17 schematically illustrates a top view of an electronic device according to a twelfth embodiment of the present disclosure.

In some embodiments, FIG. 12 may be, for example, a schematic cross-sectional view of FIG. 17 taken along a line B-B'. As shown in FIG. 12, the circuit layer 14 may optionally include a gate driver 42 electrically connected to the pixel circuit 28, and in the top view of the electronic device 1f, the switch 20 may be located between the gate driver 42 and the organic structures 16, but not limited thereto. The gate driver 42 may, for example, be electrically connected to gate terminals of the pixel circuit 28 and used to output gate driving signals to determine whether the pixel circuit 28 receives external signals. In FIG. 12, the gate driver 42 is represented by a single transistor, but not limited thereto. The gate driver 42 may, for example, include a plurality of transistors, and the transistors may include thin film transistors formed by a thin film process or MOSFETs formed by a semiconductor process. The transistors may be, for example, similar to or the same as the switch 30 and will not be repeated herein. Other parts of the electronic device 1f in FIG. 12 may refer to the structure of any one of the aforementioned or following embodiments, so details are not repeated here.

Figure 13:
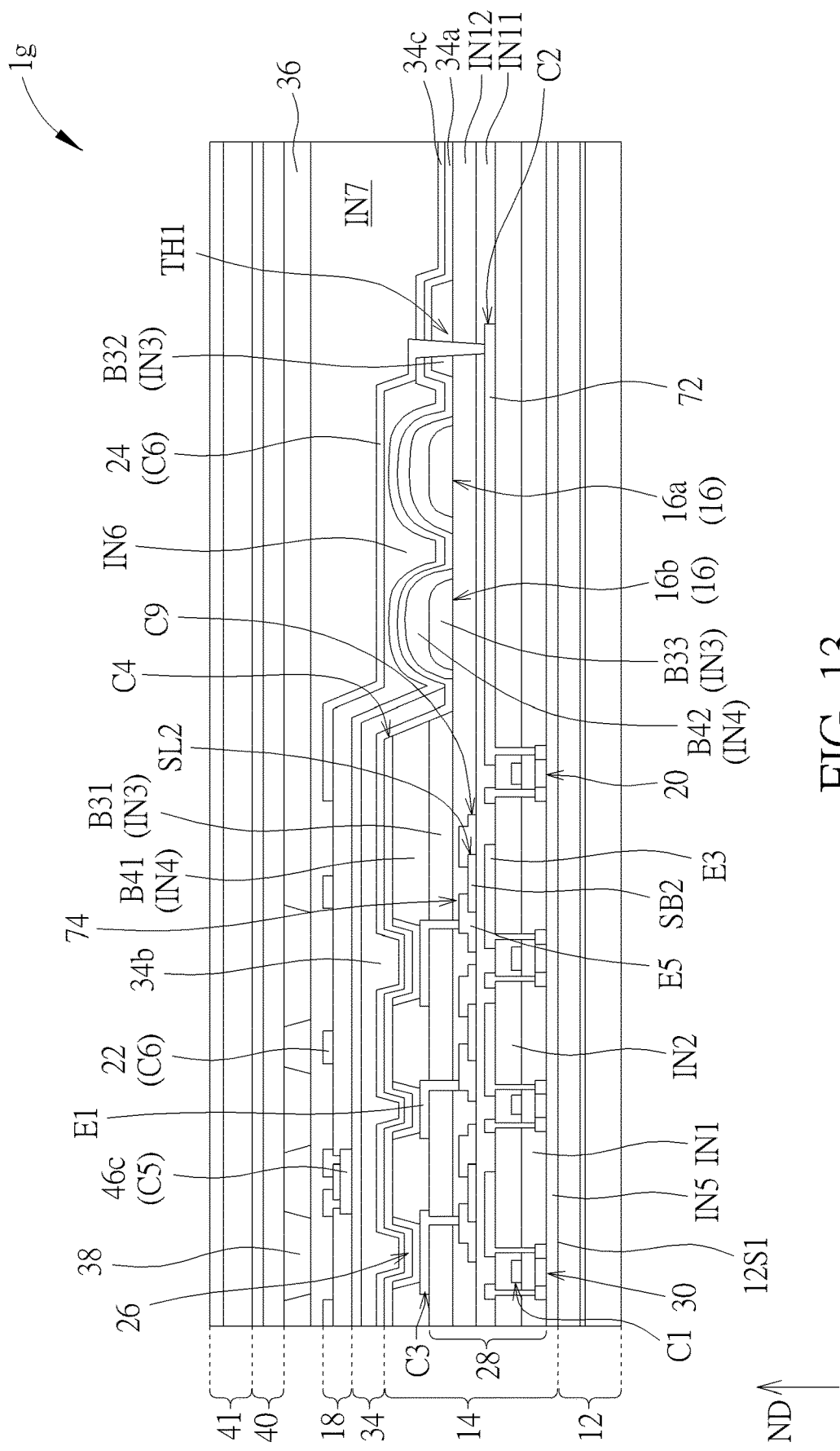
FIG. 13 schematically illustrates a cross-sectional view of an electronic device according to an eighth embodiment of the present disclosure.

Refer to FIG. 13, which schematically illustrates a cross-sectional view of an electronic device according to an eighth embodiment of the present disclosure. As shown in FIG. 13, in the electronic device 1g provided by this embodiment, the organic structures 16 may be disposed between the switch 20 and the edge 12E of the substrate 12, and the pixel circuit 28 may further include at least one switch 74. In the embodiment of FIG. 13, the switch 74 may be electrically connected between one of the switches 30 and one of the electronic units 26, but not limited thereto. In one embodiment, the switch 74 may include metal oxide, and the switch 20 may include polysilicon, so that the switch 74 and the switch 20 may have different transistor characteristics. The metal oxide may, for example, include indium gallium zinc oxide or other suitable materials. The polysilicon may, for example, include low temperature polysilicon or other suitable materials. In other embodiments, the switch 20 may include metal oxide, and the switch 74 may include polysilicon. In yet other embodiments, the switch 74 and the switch 20 may include the same semiconductor material, such as amorphous silicon, polysilicon, or metal oxide.

In the embodiment of FIG. 13, the pixel circuit 28 may further include, for example, an insulating layer IN11, a semiconductor layer SL2, a conductive layer C9, and an insulating layer IN12 sequentially disposed between the conductive layer C2 and the insulating layer IN3. In this case, a part of one of the electrodes E3 of the conductive layer C2 may serve as a gate of one of the switches 74, and the insulating layer IN11 may serve as gate insulating layers of the switches 74. The semiconductor layer SL2 may include a plurality of semiconductor blocks SB2 disposed corresponding to the electrodes E3. The conductive layer C9 may include a plurality of electrodes E5, and two adjacent electrodes E5 may be respectively disposed on two ends of one of the semiconductor blocks SB2, so that one of the electrodes E3, the insulating layer IN11, one of the semiconductor blocks SB2 and two of the electrodes E5 may form a single switch 74, but not limited thereto. One of the electrodes E5 of the switch 74 may be electrically connected to the electrode E1 of the corresponding electronic unit 26. In one embodiment, the wire 72 may be formed of the conductive layer C2, but not limited thereto. Other parts of the electronic device 1g in FIG. 13 may refer to the structure of any one of the aforementioned or following embodiments, so details are not repeated here.

Figure 14:
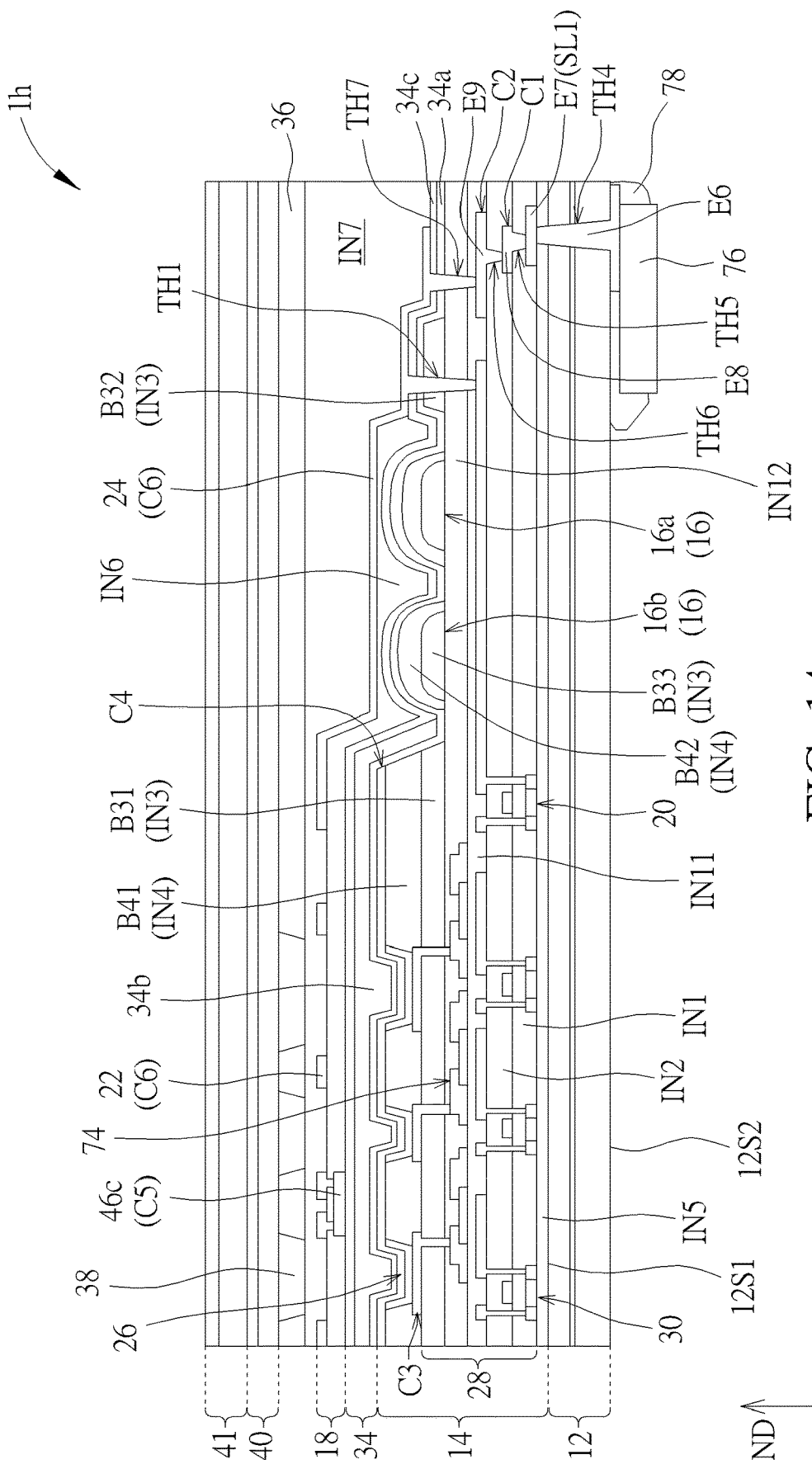
FIG. 14 schematically illustrates a cross-sectional view of an electronic device according to a ninth embodiment of the present disclosure.

Refer to FIG. 14, which schematically illustrates a cross-sectional view of an electronic device according to a ninth embodiment of the present disclosure. As shown in FIG. 14, in the electronic device 1h provided by this embodiment, the electronic device 1h may further include a control element 76 disposed on a lower surface 12S2 of the substrate 12 opposite to the upper surface 12S1 and may be electrically connected to the sensing units 22 through the wire 24. For example, the substrate 12 may have a through hole TH4, and the electronic device 1h may include a contact electrode E6 disposed on the lower surface 12S2 of the substrate 12 and disposed in the through hole TH4. Accordingly, the control element 76 disposed on the contact electrode E6 may be electrically connected to the pixel circuit 28 through the through hole TH4, so as to be further electrically connected to the wire 24. In some embodiments, the control element 76 may include, for example, a chip on film (COF), a chip, or other suitable elements. In the embodiment of FIG. 14, the through hole TH4 may further penetrate the insulating layer IN5, and the semiconductor layer SL1 may include an electrode E7 disposed corresponding to the through hole TH4, so that the contact electrode E6 may be electrically connected to the electrode E7 through the through hole TH4. The electrode E7 may, for example, include a semiconductor block doped with dopants. The insulating layer IN1 may have a through hole TH5 exposing the electrode E7, and the conductive layer C1 may include an electrode E8 electrically connected to the electrode E7 through the through hole TH5. The insulating layer IN2 may have a through hole TH6 exposing the electrode E8, and the conductive layer C2 may include an electrode E9 electrically connected to the electrode E8 through the through hole TH6. In the case that the pixel circuit 28 including the insulating layer IN11 and the insulating layer IN12, the insulating layer IN11, the insulating layer IN12, the inorganic layer 34a, and the inorganic layer 34c may have a through hole TH7 exposing the electrode E9, so that the wire 24 may be electrically connected to electrode E9 through the through hole TH7. Accordingly, the sensing units 22 may be electrically connected to the control element 76 through the wire 24, the pixel circuit 28 and the contact electrode E6. The structure of the wire 24 electrically connected to the contact electrode E6 in the present disclosure is not limited to the aforementioned and may be adjusted according to the change of layers in the pixel circuit 28.

In some embodiments, the electronic device 1h may optionally further include a protection layer 78 surrounding the control element 76 and disposed on the lower surface 12S2 of the substrate 12. The protection layer 78 may seal the through hole TH4 to reduce influence of moisture and/or oxygen on the driving signals or the sensing signals of the sensing units 22. The protection layer 78 may, for example, include waterproof glue or other suitable materials. Other parts of the electronic device 1h in FIG. 14 may be the same as or similar to the electronic device 1f in FIG. 13 and will not be repeated herein. In some embodiments, other parts of the electronic device 1h in FIG. 14 may use the structure of any one of the aforementioned or following embodiments.

Figure 15:
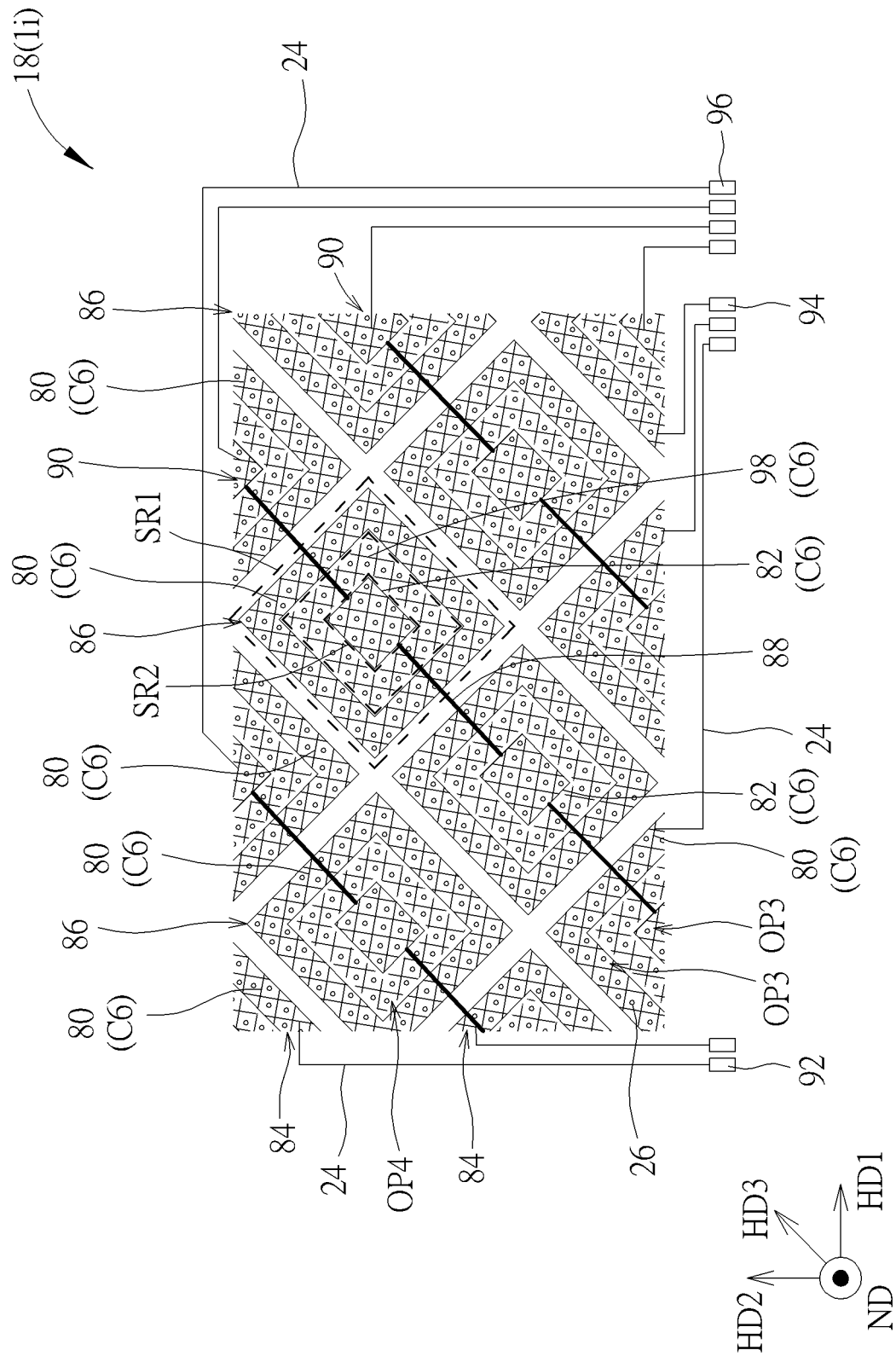
FIG. 15 schematically illustrates a top view of an electronic device according to a tenth embodiment of the present disclosure.

Refer to FIG. 15, which schematically illustrates a top view of an electronic device according to a tenth embodiment of the present disclosure. As shown in FIG. 15, in the electronic device 1i provided by this embodiment, the first sensing regions SR1 may not be overlapped with the second sensing regions SR2. In this case, the sensing structure 18 may perform the first mode and the second mode at a same time. In the embodiment of FIG. 15, the sensing structure 18 may include a plurality of sensing units 80 and a plurality of sensing units 82, in which each sensing unit 80 may have a first sensing region SR1, each sensing unit 82 may have a second sensing region SR2, and the sensing units 80 are not overlapped with the sensing units 82 in the top view of the electronic device 1i. The term "sensing region" mentioned herein may refer to a distribution region of one of the sensing units. For example, one of the sensing units 80 may have a ring-shaped top view pattern and have an opening OP4, so that the formed first sensing region SR1 is also ring-shaped. In addition, the sensing units 80 may be configured to sense the input of touch in the first mode, and the sensing units 82 may be configured to sense the input of the input device in the second mode. Since the first sensing regions SR1 do not overlap the second sensing regions SR2, the first mode and the second mode may be operated independently by the sensing units 80 and the sensing units 82, so that the first mode and the second mode may be operated by the sensing structure 18 at the same time, but not limited thereto.

In the embodiment of FIG. 15, each sensing unit 80 may surround a corresponding one of the sensing units 82, and the number of the sensing units 80 may be the same as the number of the sensing units 82, but not limited thereto. In this case, a ratio of an area of one of the sensing units 80 (or the first sensing region SR1) to an area of one of the sensing units 82 (or the second sensing region SR2) may be greater than or equal to 1 and less than or equal to 2 (i.e., 1≤(the area of the sensing unit 80/the area of the sensing unit 82)≤2), but not limited thereto.

As an example, a plurality of first sensing strings 84 and a plurality of second sensing strings 86 may be formed by connecting the sensing units 80 with bridge electrodes (not shown), in which the first sensing strings 84 may extend along the first direction HD1, and the second sensing strings 86 may extend along the second direction HD2. The first sensing strings 84 may cross over the second sensing strings 86 in the top view of the electronic device 1i, such that the first sensing strings 84 and the second sensing strings 86 may perform mutual capacitance sensing. The sensing units 80 of the same first sensing string 84 may be electrically connected to each other, for example, by bridge electrodes, and the sensing units 80 of the same second sensing string 86 may be electrically connected to each other, for example, by bridge electrodes. In FIG. 15, in order to clearly show the sensing structure 18, the bridge electrodes of the first sensing strings 84 and the second sensing strings 86 are omitted, but the present disclosure is not limited thereto. In addition, a plurality of third sensing strings 90 may be formed by connecting the sensing units 82 with bridge electrodes 88, in which the third sensing strings 90 may extend along a third direction HD3, but not limited thereto.

In the embodiment of FIG. 15, the sensing units 80 and the sensing units 82 may for example be formed of the same conductive layer C6, in which the conductive layer C6 may be, for example, the conductive layer C6 mentioned in above other embodiments, but not limited thereto. The bridge electrodes of the first sensing strings 84 and the second sensing strings 86 and/or the bridge electrodes 88 of the third sensing strings 90 may be formed of a conductive layer different from the conductive layer C6.

As shown in FIG. 15, the first sensing strings 84 may be electrically connected to the corresponding pads 92 through the corresponding wires 24 respectively, and the second sensing strings 86 may be electrically connected to the corresponding pads 94 through the corresponding wires 24 respectively. The third sensing strings 90 may be electrically connected to the corresponding pads 96 through the corresponding wires 24 respectively. The structure of the wires 24 electrically connected to the corresponding pads in FIG. 15 may refer to the contents mentioned above and will not be repeated herein.

In some embodiments, as shown in FIG. 15, the sensing structure 18 may optionally further include a plurality of dummy electrodes 98, and one of the dummy electrodes is disposed between a corresponding one of the sensing units 80 and a corresponding one of the sensing units 82. Moreover, each of the sensing units 80, the sensing units 82 and the dummy electrodes 98 may include metal meshes and may have the openings OP3, and each opening OP3 may correspond to at least one electronic unit 26. In some embodiments, the dummy electrodes 98 may be formed of the conductive layer C6, but not limited thereto. Other parts of the electronic device 1i in FIG. 15 may refer to any one of the above-mentioned or following embodiments and will not be detailed redundantly herein.

Figure 16:
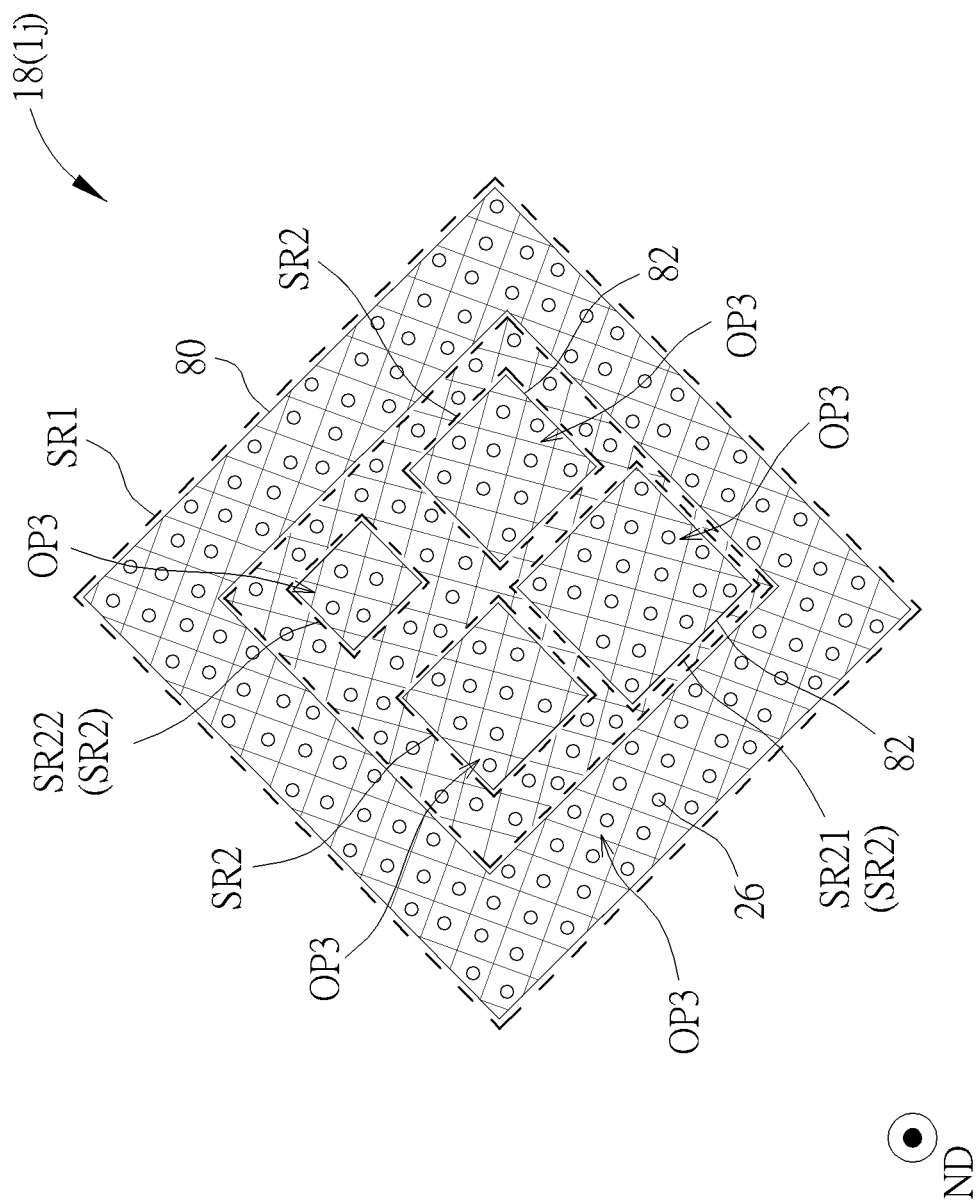
FIG. 16 schematically illustrates a top view of an electronic device according to an eleventh embodiment of the present disclosure.

Refer to FIG. 16, which schematically illustrates a top view of an electronic device according to an eleventh embodiment of the present disclosure. As shown in FIG. 16, in the sensing structure 18 of the electronic device 1j provided by this embodiment, a resolution of the sensing units 82 may be greater than a resolution of the sensing units 80. For example, at least two sensing units 82 may be surrounded by one sensing unit 80, and thus, the number of the sensing units 80 may be less than the number of the sensing units 82, but not limited thereto. In this case, the resolution of the sensing units 82 for performing the second mode may be greater than the resolution of the sensing units 80 for performing the first mode in the electronic device 1j. Also, the area of one of the sensing units 80 (or the first sensing region SR1) may be greater than the area of one of the sensing units 82 (or the second sensing region SR2). The ratio of the area of the sensing unit 80 to the area of the sensing unit 82 may be greater than 1 and less than or equal to 10 (i.e., 1<(the area of the sensing unit 80/the area of sensing unit 82)≤10), but not limited thereto. The term "area" of the sensing unit herein may, for example, refer to an area occupied by the sensing unit (or the sensing region) in the top view.

In the embodiment of FIG. 16, the sensing structure 18 may include a first number of the openings OP3 and a second number of the openings OP3, in which the first number of the openings OP3 may correspond to one of the second sensing regions SR2, the second number of the openings OP3 correspond to another one of the second sensing regions SR2, and the first number is different from the second number. Alternatively, the second sensing regions SR2 may have different areas. For example, in the sensing units 82 surrounded by the same sensing unit 80, the number of the openings OP3 corresponding to the second sensing region SR21 may be greater than the number of the openings OP3 corresponding to the second sensing region SR22, or the area of the second sensing region SR21 may be greater than the area of the second sensing region SR22, but not limited thereto. In some embodiments, in the sensing units 82 surrounded by the same sensing unit 80, the number of the openings OP3 corresponding to different second sensing regions SR2 may be the same as each other, or the areas of at least two second sensing regions SR2 may be the same as each other. It should be noted that since the numbers or areas of the openings OP3 corresponding to different second sensing regions SR2 may be different, or different second sensing regions SR2 have different areas, layout patterns of the sensing units 82 may be adjusted according to different electronic units 26, or the sensing units 82 with different areas may generate different signal intensities based on the requirements. Other parts of the electronic device 1j in FIG. 16 may refer to any one of the above-mentioned or following embodiments and will not be detailed redundantly herein.

Refer to FIG. 17, which schematically illustrates a top view of an electronic device according to a twelfth embodiment of the present disclosure. As shown in FIG. 17, in the electronic device 1k provided by this embodiment, the second sensing regions SR2 of different sensing units 82 may have different areas. In the embodiment of FIG. 17, the substrate 12 may include a folding region FR and a non-folding region NFR, and an area of one of the second sensing regions SR2 (or the sensing units 82) in the folding region FR may be less than an area of another one of the second sensing regions SR2 (or the sensing units 82) in the non-folding region NFR, so that influence of bending the electronic device 1k on the sensing units 82 in the folding region FR may be mitigated. In the present disclosure, the folding region FR is a foldable area in the electronic device 1k. When the electronic device 1k is in a folded state, the folding region FR may be folded with a folding line FA as an axis. When the electronic device 1k is in a using state, the folding region FR may be in an unfolded or incompletely folded state. Other parts of the electronic device 1k in FIG. 17 may refer to any one of the aforementioned or following embodiments and will not be detailed redundantly herein.

In some embodiments, the sensing units 80 and the sensing units 82 may be disposed in the folding region FR, and at least one wire 24 may extend from the non-folding region NFR to the folding region FR to be electrically connected to the sensing units 82 in the folding region FR. In FIG. 17, regions of the plurality of switches 20 are used to represent their positions, in which the switches 20 may be disposed in the non-folding region FR, but not limited thereto. Through this structure, a damage to the switches 20 resulted from bending the electronic device 1k may be mitigated. Moreover, since the sensing units 80 and the sensing units 82 may be disposed in the folding region FR, a problem of poor touch sensitivity in the folding region FR may be improved.

In some embodiments, the switches 20 may not be disposed between one of the gate drivers 42 and the corresponding part of the organic structure 16, so that the switches 20 and the corresponding gate driver 42 may be respectively disposed adjacent to two opposite sides of the substrate 12 (or disposed on two opposite sides of the corresponding part of the organic structure 16), but not limited thereto.

Figure 18:
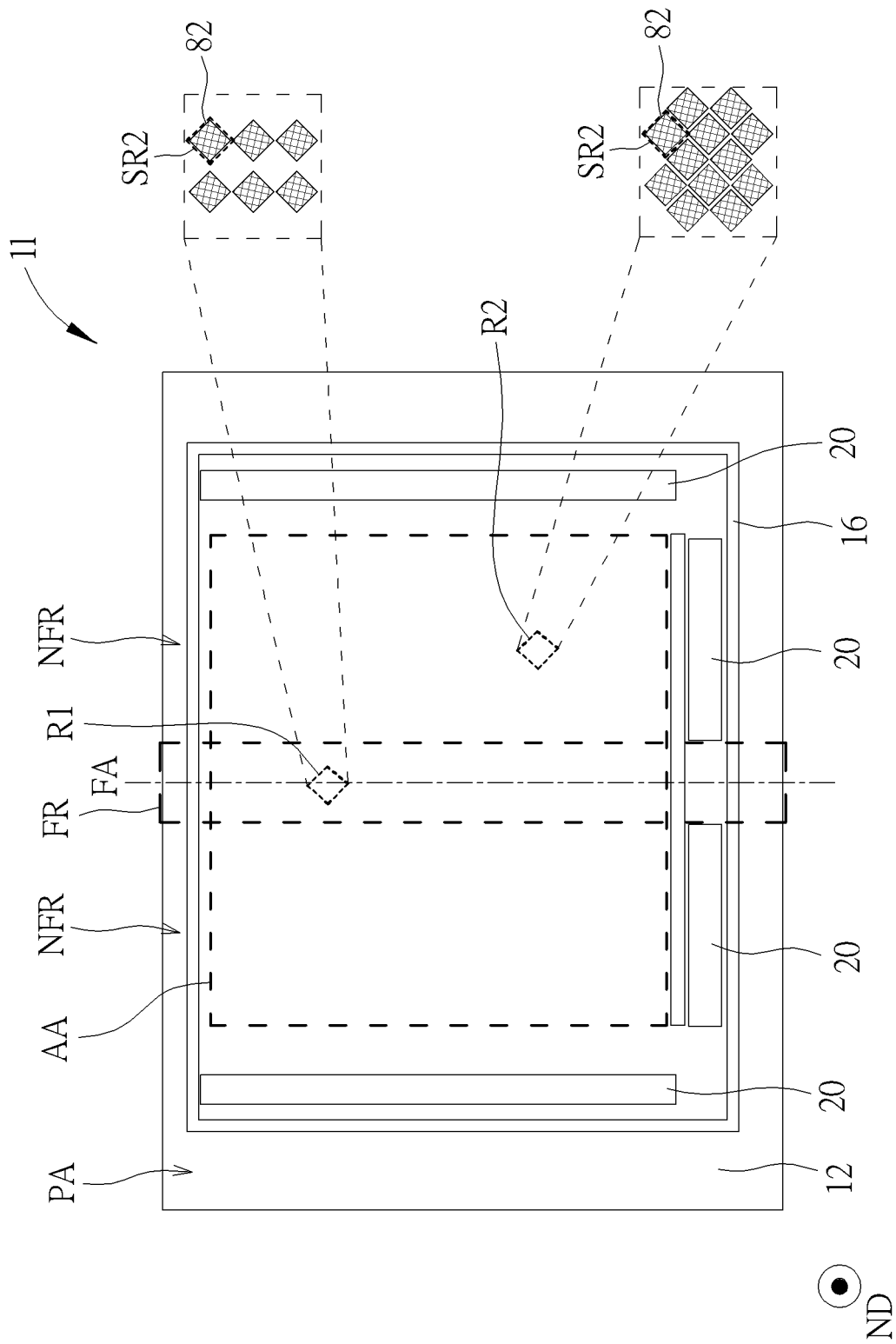
FIG. 18 schematically illustrates a top view of an electronic device according to a t thirteenth embodiment of the present disclosure.

Refer to FIG. 18, which schematically illustrates a top view of an electronic device according to a thirteenth embodiment of the present disclosure. As shown in FIG. 18, in the electronic device 11 provided by this embodiment, the second sensing regions SR2 (or the sensing units 82) in different areas may have different distribution densities. In the embodiment of FIG. 18, a distribution density of the second sensing regions SR2 in the folding region FR may be less than a distribution density of the second sensing regions SR2 in the non-folding region NFR. The term "distribution density" mentioned here may be, for example, the number of the second sensing regions SR2 in a unit area. For example, an area of a region R1 in the folding region FR may be the same as that of a region R2 in the non-folding region NFR, and the number of the second sensing regions SR2 in the region R1 may be less than the number of the second sensing regions SR2 in the region R2, but not limited thereto. Other parts of the electronic device 11 in FIG. 18 may refer to any one of the above-mentioned embodiments and will not be detailed redundantly herein.

In conclusion, in the electronic device of the present disclosure, the wire electrically connected to the sensing units may cross over the organic structure and be electrically connected to the switch in the circuit layer, so that the sensing structure may be disposed on the encapsulation layer and be electrically connected to the switch in the circuit layer without affecting the protection effect of the encapsulation layer, thereby reducing the overall thickness and weight of the electronic device and/or reducing the cost.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a substrate;
a circuit layer disposed on the substrate, and the circuit layer comprising a first switch;
an organic structure disposed on the substrate, wherein in a top view of the electronic device, the organic structure is adjacent to an edge of the substrate; and
a sensing structure disposed on the circuit layer, and the sensing structure comprising a sensing unit and a first wire electrically connected to the sensing unit;
wherein the first wire crosses over the organic structure and is electrically connected to the first switch, and
wherein the substrate comprises a folding region and a non-folding region, the sensing unit is disposed on the folding region, and the first switch is disposed on the non-folding region.

2. The electronic device according to claim 1, further comprising an insulating layer disposed between the organic structure and the first wire.

3. The electronic device according to claim 2, wherein the insulating layer comprises organic material.

4. The electronic device according to claim 1, wherein in the top view of the electronic device, the organic structure is disposed between the first switch and the edge of the substrate.

5. The electronic device according to claim 1, wherein in the top view of the electronic device, the first switch is located between the organic structure and the edge of the substrate.

6. The electronic device according to claim 1, wherein the circuit layer further comprises an electronic unit and a pixel circuit configured to control the electronic unit, and the pixel circuit comprises a second switch, wherein the second switch comprises metal oxide, and the first switch comprises polysilicon.

7. The electronic device according to claim 1, wherein the sensing structure is configured to sense an input by touch in a first mode and is configured to sense another input by an input device in a second mode.

8. The electronic device according to claim 1, wherein the circuit layer comprises a plurality of electronic units, the sensing structure comprises a plurality of openings, and one of the plurality of openings overlaps at least one of the plurality of electronic units.

9. The electronic device according to claim 1, wherein the sensing structure comprises a plurality of first sensing regions configured to sense an input by touch in a first mode, and the sensing structure further comprises a plurality of second sensing regions configured to sense the another input by an input device in a second mode.

10. The electronic device according to claim 9, wherein the plurality of first sensing regions are overlapped with the plurality of second sensing regions.

11. The electronic device according to claim 10, wherein the first mode and the second mode are operated by the sensing structure at different times.

12. The electronic device according to claim 9, wherein the plurality of first sensing regions are not overlapped with the plurality of second sensing regions.

13. The electronic device according to claim 12, wherein the first mode and the second mode are operated by the sensing structure at a same time.

14. The electronic device according to claim 12, wherein at least two of the plurality of second sensing regions are surrounded by one of the plurality of first sensing regions.

15. The electronic device according to claim 9, wherein the sensing structure comprises a first number of openings corresponding to one of the plurality of second sensing regions and a second number of openings corresponding to another one of the plurality of second sensing regions, and the first number is different from the second number.

16. The electronic device according to claim 9, wherein the substrate comprises a folding region and a non-folding region, and an area of one of the plurality of second sensing regions in the folding region is less than an area of another one of the plurality of second sensing regions in the non-folding region.

17. The electronic device according to claim 9, wherein the substrate comprises a folding region and a non-folding region, and a distribution density of the plurality of second sensing regions in the folding region is less than a distribution density of the plurality of second sensing regions in the non-folding region.

18. An electronic device, comprising:
a substrate;
a circuit layer disposed on the substrate, and the circuit layer comprising a first switch;
an organic structure disposed on the substrate, wherein in a top view of the electronic device, the organic structure is adjacent to an edge of the substrate; and
a sensing structure disposed on the circuit layer, and the sensing structure comprising a sensing unit and a first wire electrically connected to the sensing unit;
wherein the first wire crosses over the organic structure and is electrically connected to the first switch,
wherein the circuit layer further comprises a second wire disposed under the organic structure and electrically connected to the first wire and the first switch.

19. An electronic device, comprising:
a substrate;
a circuit layer disposed on the substrate, and the circuit layer comprising a first switch;
an organic structure disposed on the substrate, wherein in a top view of the electronic device, the organic structure is adjacent to an edge of the substrate; and
a sensing structure disposed on the circuit layer, and the sensing structure comprising a sensing unit and a first wire electrically connected to the sensing unit;
wherein the first wire crosses over the organic structure and is electrically connected to the first switch,
wherein the circuit layer further comprises an electronic unit, a pixel circuit configured to control the electronic unit, and a gate driver electrically connected to the pixel circuit, and the first switch is located between the gate driver and the organic structure in a top view of the electronic device.

* * * * *